US012205793B2

United States Patent
Yun et al.

(10) Patent No.: US 12,205,793 B2
(45) Date of Patent: Jan. 21, 2025

(54) METHOD AND APPARATUS FOR ANISOTROPIC PATTERN ETCHING AND TREATMENT

(71) Applicant: Lam Research Corporation, Fremont, CA (US)

(72) Inventors: Seokmin Yun, Dublin, CA (US); Shuogang Huang, Fremont, CA (US); Zhimin Wan, Fremont, CA (US); Mark Merrill, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 190 days.

(21) Appl. No.: 17/163,248

(22) Filed: Jan. 29, 2021

(65) Prior Publication Data

US 2021/0151290 A1 May 20, 2021

Related U.S. Application Data

(62) Division of application No. 15/809,957, filed on Nov. 10, 2017, now abandoned.

(51) Int. Cl.
*H01J 37/305* (2006.01)
*H01J 37/32* (2006.01)
(Continued)

(52) U.S. Cl.
CPC .... *H01J 37/3053* (2013.01); *H01J 37/32183* (2013.01); *H01L 21/3065* (2013.01);
(Continued)

(58) Field of Classification Search
CPC ............ H01J 37/3053; H01J 37/32183; H01J 2237/006; H01J 2237/334; H01L 21/3065;
(Continued)

(56) References Cited

U.S. PATENT DOCUMENTS

| 2002/0163612 A1* | 11/2002 | Chaudhari | .......... G02F 1/13378 349/124 |
| 2004/0124371 A1* | 7/2004 | Lee | ..................... G02F 1/13378 250/492.1 |

(Continued)

FOREIGN PATENT DOCUMENTS

JP 2005116865 A * 4/2005
KR 20040058898 A * 7/2004

*Primary Examiner* — Parviz Hassanzadeh
*Assistant Examiner* — Margaret Klunk
(74) *Attorney, Agent, or Firm* — Penilla IP, APC

(57) ABSTRACT

Methods and apparatuses for providing an anisotropic ion beam for etching and treatment of substrate are discussed. In one embodiment, a system for processing a substrate includes a chamber, a chuck assembly, an ion source, and a grid system. The ion source includes grid system interfaces both the chamber and the ion source and includes a plurality of holes through which ions are extracted from the ion source to form an ion beam. The grid system is oriented so the ion beam is directed into the chamber toward the substrate support, and the array of holes of the grid system is defined vertically by a y-axis and horizontally by an x-axis, The array of holes is defined by hole densities that vary vertically in the y-axis such that the ion beam is caused to have an energy density gradient that is defined vertically in the y-axis.

19 Claims, 15 Drawing Sheets

(51) Int. Cl.
*H01L 21/3065* (2006.01)
*H01L 21/67* (2006.01)
*H01L 21/687* (2006.01)

(52) U.S. Cl.
CPC .. *H01L 21/67069* (2013.01); *H01L 21/67213* (2013.01); *H01L 21/68764* (2013.01); *H01J 2237/006* (2013.01); *H01J 2237/334* (2013.01)

(58) Field of Classification Search
CPC ......... H01L 21/67069; H01L 21/67213; H01L 21/68764
See application file for complete search history.

(56) References Cited

U.S. PATENT DOCUMENTS

| | | | | |
|---|---|---|---|---|
| 2005/0001177 A1* | 1/2005 | Okazaki | ............ | H01J 37/3023 250/492.21 |
| 2005/0224796 A1* | 10/2005 | Zhang | ............ | H01L 27/127 257/E27.111 |
| 2008/0156771 A1* | 7/2008 | Jeon | ............ | H01J 37/32357 156/345.43 |
| 2008/0179546 A1* | 7/2008 | Lee | ............ | H01J 37/08 250/492.21 |
| 2009/0098306 A1* | 4/2009 | Druz | ............ | H01J 37/32752 427/523 |
| 2010/0084584 A1* | 4/2010 | Hino | ............ | H01J 37/20 250/492.21 |
| 2013/0098552 A1* | 4/2013 | Dorf | ............ | H01J 37/3233 156/345.4 |
| 2014/0206197 A1* | 7/2014 | Nakagawa | ........ | H01L 29/66803 438/712 |
| 2014/0261171 A1* | 9/2014 | Hahto | ............ | H01J 37/3007 118/712 |
| 2015/0090583 A1* | 4/2015 | Kodaira | ............ | H01J 37/32357 204/192.34 |
| 2015/0255243 A1* | 9/2015 | Godet | ............ | H01J 37/32899 156/345.39 |
| 2015/0318185 A1* | 11/2015 | Kodaira | ............ | H01L 22/20 156/345.28 |
| 2017/0069526 A1* | 3/2017 | Park | ............ | H01J 37/20 |
| 2020/0176214 A1* | 6/2020 | Pearson | ............ | H01J 37/3053 |

* cited by examiner

Hole density (# of holes/mm^2)

METHOD AND APPARATUS FOR ANISOTROPIC PATTERN ETCHING AND TREATMENT

CLAIM OF PRIORITY

This application is a Divisional application under 35 U.S.C. 120 of prior U.S. application Ser. No. 15/809,957, filed Nov. 10, 2017, and entitled, "Method and Apparatus for Anisotropic Pattern Etching and Treatment", which is incorporated herein by reference in its entirety for all purposes.

BACKGROUND

1. Field of the Disclosure

The present embodiments relates to methods, systems, and programs for improving etching on a semiconductor manufacturing chamber, and more particularly, methods, systems, and computer programs for improving ion beam etching uniformity in high tilt angle etching processes.

2. Description of the Related Art

In semiconductor manufacturing, etching processes are commonly and repeatedly carried out. As is well known to those skilled in the art, there are two types of etching processes: wet etching and dry etching. One type of dry etching is plasma etching performed using an inductively coupled plasma (ICP) etching apparatus.

Plasma contains various types of radicals, as well as positive and negative ions. The chemical reactions of the various radicals, positive ions, and negative ions are used to etch features, surfaces, and materials of a substrate.

What is desired is uniform ion beam etching for substrates that are high tilted relative to the direction of the ion beam. It is in this context that embodiments arise.

SUMMARY

Methods, devices, systems, and computer programs are presented for controlling the gradient of ion beam density for an ion beam that is incident on a substrate. It should be appreciated that the present embodiments can be implemented in numerous ways, such as a method, an apparatus, a system, a device, or a computer program on a computer readable medium. Several embodiments are described below.

In one embodiment, a system for processing a substrate includes a chamber, a chuck assembly, an ion source, and a grid system. The chuck assembly includes a substrate support, a tilt assembly for tilting the substrate support, and rotation assembly for rotating the substrate support. The ion source is directionally orientated toward the substrate support and is configured to generate ions when plasma is struck. The grid system interfaces both the chamber and the ion source and includes a plurality of holes through which ions are extracted from the ion source to form an ion beam. The size of the plurality holes varies along an axis such that the ion density of the ion beam also varies along the axis.

In one embodiment, a system for processing a substrate includes a chamber, a chuck assembly, an ion source, and a grid system. The chuck assembly includes a substrate support, a tilt assembly for tilting the substrate support, and rotation assembly for rotating the substrate support. The ion source is directionally orientated toward the substrate support and is configured to generate ions when plasma is struck. The grid system interfaces both the chamber and the ion source and includes a plurality of holes through which ions are extracted from the ion source to form an ion beam. The density of the plurality holes varies along an axis such that the ion density of the ion beam also varies along the axis.

In one embodiment, a system for processing a substrate includes a chamber, a chuck assembly, an ion source, and a grid system. The chuck assembly includes a substrate support, a tilt assembly for tilting the substrate support, and rotation assembly for rotating the substrate support. The ion source is directionally orientated toward the substrate support and is configured to generate ions when plasma is struck. The grid system interfaces both the chamber and the ion source and includes an array of holes for extracting ions from the ion source and for forming an ion beam. The grid system is oriented such the ion beam is directed into the chamber toward the substrate support. The grid system is defined vertically by a y-axis and horizontally by an x-axis. The grid system may be planar. Further the grid system is defined by a plurality of sections that are individually definable or controlled for voltage. The resulting ion beam has an energy density with respect to its beam cross section that is defined by the respective voltages of the plurality of sections of the grid system. As a result, the embodiment is contemplated to be able to define any number of energy density gradients with respect to beam cross section by individually controlling respective voltages of the plurality of sections.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

Figure 1A:
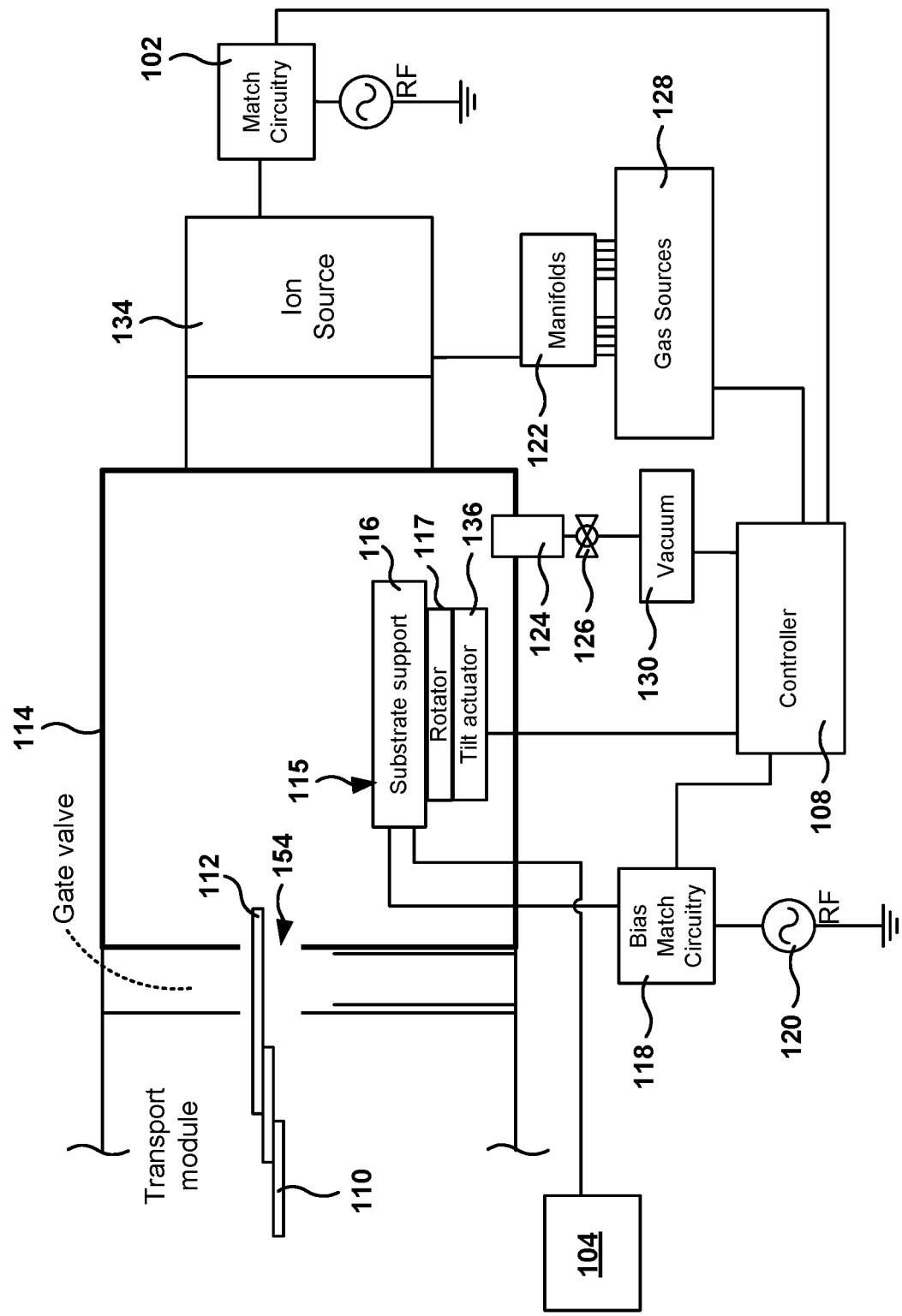
FIG. 1A is a schematic cross-section diagram showing a plasma processing system utilized for etching operations, in accordance with one embodiment.

Embodiments provide anisotropic ion beams for ion beam etching or milling or sputtering of a substrate. In some embodiments, the anisotropic ions beam may be used to etch a substrate that is tilted. High substrate tilt during ion beam etching enables sidewall pattern etching as well as suppressed vertical etching. For example, in high-tilt ion beam etching (IBE) configurations, etching of photoresist that is deposited on top of the substrate may be suppressed because the etching angle is made to be more directed to the horizontal directions (e.g., sidewalls) and less in the vertical directions (e.g., height of a pattern).

In some embodiments, the substrate may be tilted 10-89° relative to the substrate angle used for vertical etching. That is, the substrate may be tilted such that an axis orthogonal to a plane of the substrate is angled 10-89° relative to the direction of the ion beam. Under high tilt configurations during ion beam etching, the substrate may experience different ion densities and/or energy densities at different locations on the substrate. Regions of the substrate that are tilted closer to the inductively coupled plasma (ICP) source may experience higher ion densities than regions that are tilted away from the ICP source.

Generally, ion density (and energy density) of the ion beam decreases as a function of a distance away from the ICP source because of divergence of the ion beam. For example, ions that are extracted from the ICP source using a grid do not follow a perfectly parallel trajectory. This results in divergence of the ion beam. Moreover, the (positive) ions that are extracted by the grid from the plasma source will tend to experience repulsion due to their like charges. This also results in divergence of the ion beam.

As a result of this divergence of the ion beam, regions of a tilted substrate during ion beam etching that are tilted closer in distance to the ICP source will experience higher energy densities than regions that tilted away from the ICP ion source. This creates a "positional bias" in etch, where regions of a substrate that are tilted closer to the ICP source are provided with a higher etch rate due to higher ion beam energy density (e.g., ion density and/or ion energy).

In some embodiments, the substrate may be rotated to compensate for the non-uniformity of etch rates due to positional bias of etch. However, even when rotated, certain asymmetries of etch rates may occur. For example, sidewalls (e.g., vertical surfaces) that face the center of the substrate will consistently experience smaller ion beam energy densities even when the substrate is continually rotated. Conversely, sidewalls that face the perimeter or circumference of the substrate will consistently experience greater ion beam energy densities even when the substrate is rotated. As a result, an asymmetry in etch rate will exist depending on whether a given sidewall of a pattern faces the center or the perimeter the substrate. This asymmetry in sidewall etch rates may be referred to as a "directional bias" that is biases perimeter or circumference-facing sidewalls. Directional bias (e.g., etch bias for perimeter facing sidewalls) is apparent despite providing the substrate with rotation, although rotation may control for some positional bias of etch.

The perimeter-facing bias will be more noticeable as a function of radial distance away from the center of the substrate. For example, regions that are more radially distant from the center of the substrate will experience a greater perimeter-facing bias than regions that are closer to the center of the substrate.

Embodiments contemplated here also enabled 1-dimensional horizontal etching as a result of the provided improvement to ion beam density gradients, as will be discussed in further detail below. Horizontal etching (e.g., etching in the x- and y-axes of a planar substrate) is advantageous for a number of reasons. One of the advantages includes etching vertical features such as sidewalls without diminishing a height of photoresist or other masking layer that is deposited on top of the substrate.

In 1-dimensional etching, for example, etching or milling of a substrate is done along one axis only at a time. For example, a substrate may be etched in the −y direction first. Then after rotating the substrate 180°, the substrate may then be etched in the +y direction. For 1-dimensional etching, a bias of etch rate will also be apparent depending on the directionality of the sidewalls. Namely, sidewalls that face a center line of the substrate (e.g., facing toward a line y=0, where the plane of the substrate is defined by x- and y-axes with the center at (0, 0)) will be etched at lower rates than sidewalls that face away from the center line (e.g., facing toward lines y=±∞), even if the two sidewalls are virtually in the same location on the substrate. This is because inward facing sidewalls (e.g., sidewalls facing y=0) are etched during in high tilt applications at consistently greater distances from the ion source than outward-facing sidewalls (e.g., sidewalls facing y=±∞).

Embodiments contemplated here are for anisotropic ion beam configurations that provide anisotropic ion beams having a controllable ion beam energy density gradient defined along one or more axes of a cross-section of the ion beam. As used herein, anisotropic ion beams are ion beams having a non-uniform or non-homogenous energy densities across one or more axis. It is contemplated that the anisotropic ion beams are to be implemented to improve uniformity of ion beam etching across a substrate by creating a uniform ion beam energy density at the substrate, or by creating a non-uniform ion beam energy density to either compensate for a non-uniformity of a prior processing step, or to preempt a predicted non-uniformity in one or more future steps.

The envisioned ion beam energy density gradient may be controlled by defining a gradient of ion density and/or ion energy across one or more axes of the cross-section of the ion beam. The gradient of ion density and/or ion energy (referred collectively herein as ion beam energy density) may be controlled in by using embodiments of grid systems discussed below. The resulting anisotropic ion beam having an ion beam energy density gradient is able to provide etch rate uniformity across a substrate axis under high tilt ion beam etching applications. Embodiments contemplated here also improve both positional bias and/or directional bias of etching. For example, certain embodiments improve upon a directional bias such that there is greater symmetry of etch rates between sidewalls that face the center of the substrate and sidewalls that face the perimeter of the substrate for ion beam etching with continual substrate rotation and without.

For 1-dimensional etching (substrate is not continually rotated, but periodically rotated by 180°), embodiments contemplated here improve upon the etch bias for outward-facing sidewalls over inward facing sidewalls. In other words, embodiments of anisotropic ion beams contemplated here may improve upon both ion beam etching applications with continual substrate rotation and in applications for 1-dimensional etching without continual substrate rotation.

It is contemplated that anisotropy of the ion beam may be implemented by controlling the ion beam density as a function of a y-axis (or any arbitrarily defined axis) of the grid of the ICP source to create a gradient of ion beam energy density that is greater toward one end of the y-axis and lesser toward another end. In one embodiment, the gradient is such that the ion beam density is greater as y is less positive (e.g., the gradient is inversely proportional to the y-axis, or the energy density decreases as the y-coordinate increases). In this embodiment, regions of the substrate that are tilted closer to the ICP source will experience as similar ion beam density as regions that tiled farther away from the ICP source. Thus, uniformity of etch rates across the y-axis of the substrate will be improved. Moreover, the perimeter-facing bias will also be improved upon as a result of the gradient of ion beam density.

The following embodiments describe methods, devices, systems, and computer programs for controlling the gradient of ion beam density for ion beam etching of substrate that is highly tilted. It will be apparent, that the present embodiments may be practiced without some or all of these specific details. In other instances, well-known process operations have not been described in detail in order not to unnecessarily obscure the present embodiments.

FIG. 1A is a schematic cross-section diagram showing a plasma processing system utilized for etching operations, in accordance with one embodiment. The system includes a transport module 110 that carries the substrate 112, a gate valve, and ion beam chamber 114. The substrate 112 enters the chamber through a substrate load 154, with the substrate 112 being in a horizontal position when the substrate enters the ion beam chamber 114. The chamber includes chuck assembly 115 and tilt actuator 136. Chuck assembly 115 includes substrate support 116. In some embodiments a dielectric window 106 is also present (not shown) in the chamber. The substrate support 116 can be an electrostatic chuck for supporting substrate 112.

Tilt actuator 136 tilts the chuck assembly after the substrate has been loaded, in order to perform the processing of the substrate while the substrate is in the tilted position. As noted above, the substrate may be tilted by way of tilt actuator 136 and chuck 115 up to near 90° for horizontal etching of sidewalls relative to the direction of the ion beam. That is, the chuck 115 and substrate support 116 may be tilted nearly 180° from the loading position. Also shown in FIG. 1A is rotator 117, which may be implemented to rotate the substrate around its center.

Facilities 104 are connected to the chuck assembly to provide electrical power to the substrate support, or to provide liquid or gas to cool the substrate during operation. An ion source cavity 134 generates the plasma for processing the substrate. In some embodiments, an internal faraday shield (not shown) is disposed inside the ion beam chamber 114. In some embodiments, the ion source cavity 134 includes a transformer coupled plasma (TCP) coil connected to match circuitry 102.

Further shown is a bias RF generator 120, which can be defined from one or more generators. If multiple generators are provided, different frequencies can be used to achieve various tuning characteristics. A bias match 118 is coupled between the RF generator 120 and a conductive plate of the assembly that defines the substrate support 116. The substrate support 116 also includes electrostatic electrodes to enable the chucking and dechucking of the substrate. Broadly, a filter and a DC clamp power supply can be provided. Other control systems for lifting the substrate off of the substrate support 116 can also be provided.

Gas sources 128 include a plurality of gas sources that can be mixed through manifolds 122. The gas sources include one or more reactant gases (also referred to herein as main gases) and one or more tuning gases. A reactant gas is an active gas used for etching, and the reactant gas is a source of the species necessary for etching over the substrate. Examples of reactant gases include $Cl_2$, HBr, and $SF_6$, but other reactant gases may also be used. It should be appreciated that multiple gas supplies may be provided for supplying different gases to the chamber for various types of operations, such as process operations on substrates, substrate-less auto-cleaning operations, and other operations.

A vacuum pump 130 is connected to the ion beam chamber 114 to enable vacuum pressure control and removal of gaseous byproducts from the chamber during operational plasma processing. A valve 126 is disposed between exhaust 124 and the vacuum pump 130 to control the amount of vacuum suction being applied to the chamber. Although not shown, one or more vacuum apparatuses are also provide vacuum to the ion source cavity 134.

The ion beam chamber 114 will also operate at vacuum conditions in the range of between about 0.1 m Torr (mT) and about 1 m Torr (mT). The ion source cavity 134 may operate at vacuum conditions in the range of about 1 mT to about 10 mT, although other specifications may be used. Although not all specifically shown, ion beam chamber 114 is typically coupled to facilities when installed in a clean room, or a fabrication facility. Facilities include plumbing that provide processing gases, vacuum, temperature control, and environmental particle control.

A programmable controller 108 is provided for controlling the operation of the ion beam chamber 114 and its associated components. Broadly speaking, the controller 108 can be programmed to execute a chamber operation defined by a recipe. A given recipe may specify various parameters for the operation, such as the application of power to the TCP coils, the flow of gas into the chamber, and the application of vacuum. It should be appreciated that the timing, duration, magnitude, or any other adjustable parameter or controllable feature can be defined by a recipe and carried out by the controller to control the operation of the ion beam chamber 114 and its associated components. Additionally, a series of recipes may be programmed into the controller 108.

Figure 1B:
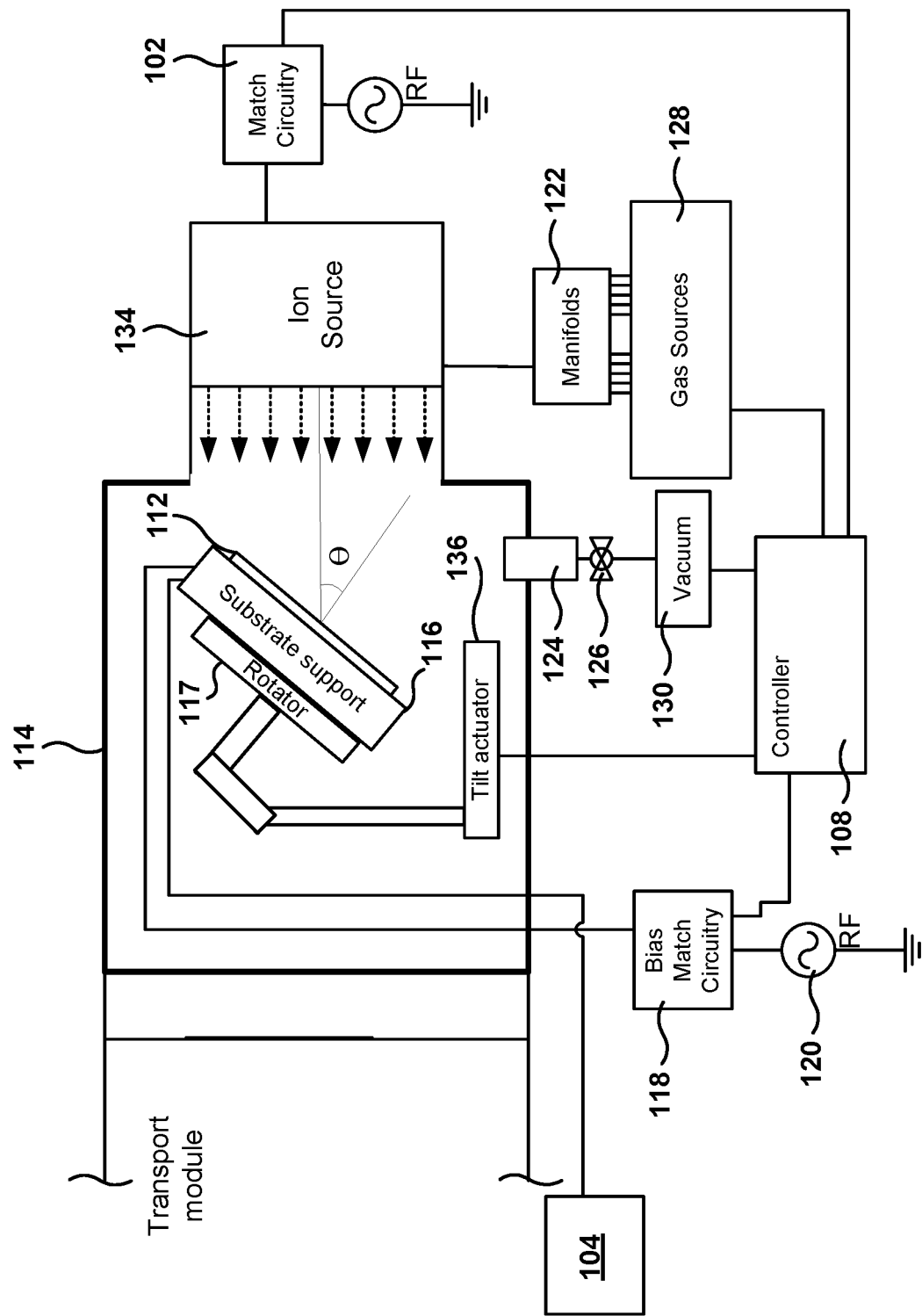
FIG. 1B illustrates the chamber during operation, according to one embodiment.

FIG. 1B illustrates the chamber during operation, according to one embodiment. In one embodiment, the substrate 112 is loaded into the substrate support 116, and after the substrate is loaded, the position actuator rotates substrate support 116 100°-179° to place substrate support 116 and substrate 112 in a tilted position before the plasma is ignited. The tilted position is defined by angle θ, which may be between 10° to nearly 90°. In some embodiments, the tilt angle θ is about 85°. The ion source cavity 134 is disposed on the side of the chamber in a vertical orientation.

Figure 2:
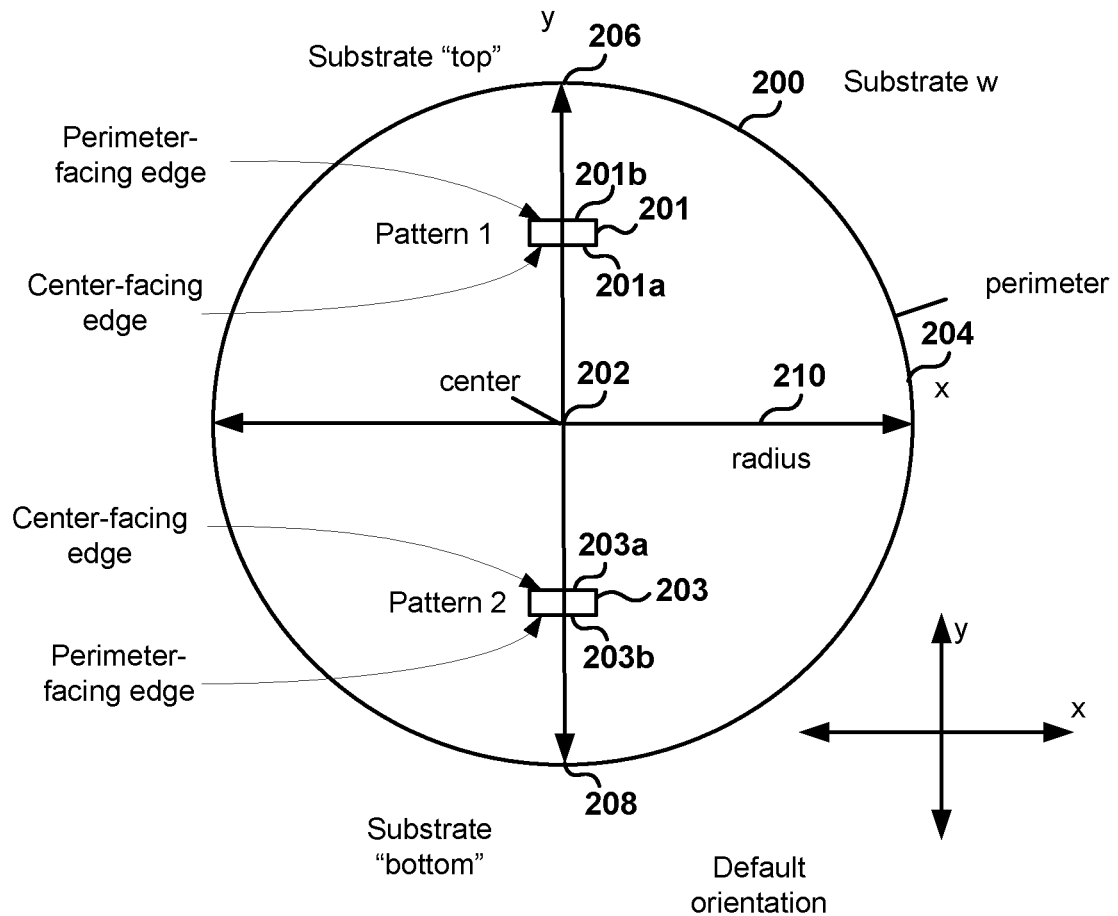
FIG. 2 illustrates various features of a substrate w that is configured for ion beam etching, according to one embodiment.
Figure 2:
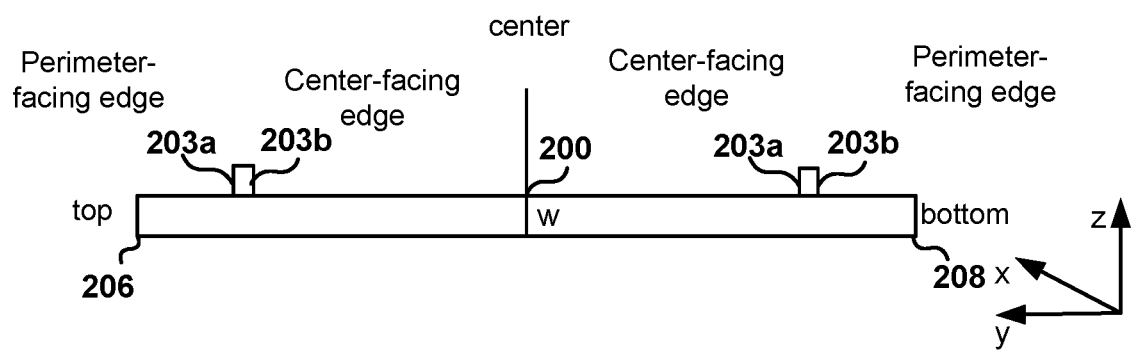

FIG. 2 illustrates various features of a substrate 200 that may be used for high tilt ion beam etching processes. The substrate 200 is shown to be a circular wafer, although other shapes are compatible with the methods and systems provided here. The substrate 200 is defined by an x-axis and a y-axis, with the center 202 of the substrate 200 being defined at x=0 and y=0 of the substrate axes. In addition to the substrate axes, x and y-axes of the plane of the substrate 200 are also defined. When the substrate is in a "default" orientation, the y-axis of the substrate 200 is in the same direction of the y-axis of the plane. This orientation of the substrate 200 may thus be referred to as the default orientation, or the orientation where y=0°. When the substrate 200 is rotated by 180° around its center, the substrate 200 may be said to be in a rotated orientation, or where the y-axis of substrate 200 is 180° relative to the y-axis of the plane that the substrate 200 is in. That is, the rotated orientation is where y=−180° or y=+180°.

The substrate includes a "top" and a "bottom" for reference. The top 206 refers to a point or a region associated with coordinates of the substrate 200 of (φ=0, r=r) in polar coordinates while the bottom 208 of the substrate is associated with coordinates of (φ=180°, r=r). Additional features of substrate 200 include a radius 210, and a perimeter 204. Radius 210 may be anywhere between about 20 mm to about 1000 mm, or between about 100 mm and about 250 mm.

FIG. 2 shows substrate 200 to include a first pattern 201 and a second pattern 203. The first pattern 201 is shown to have a center-facing edge 201a and a perimeter-facing edge 201b. As used herein, an edge may refer to a sidewall caused by vertical etching, or any surface that is not parallel to the plane of the substrate 200. The second pattern 203 is also shown to have a center-facing edge 203a and a perimeter-facing edge 203b. FIG. 2 also shows a cut-away view of the substrate 200.

Figure 3:
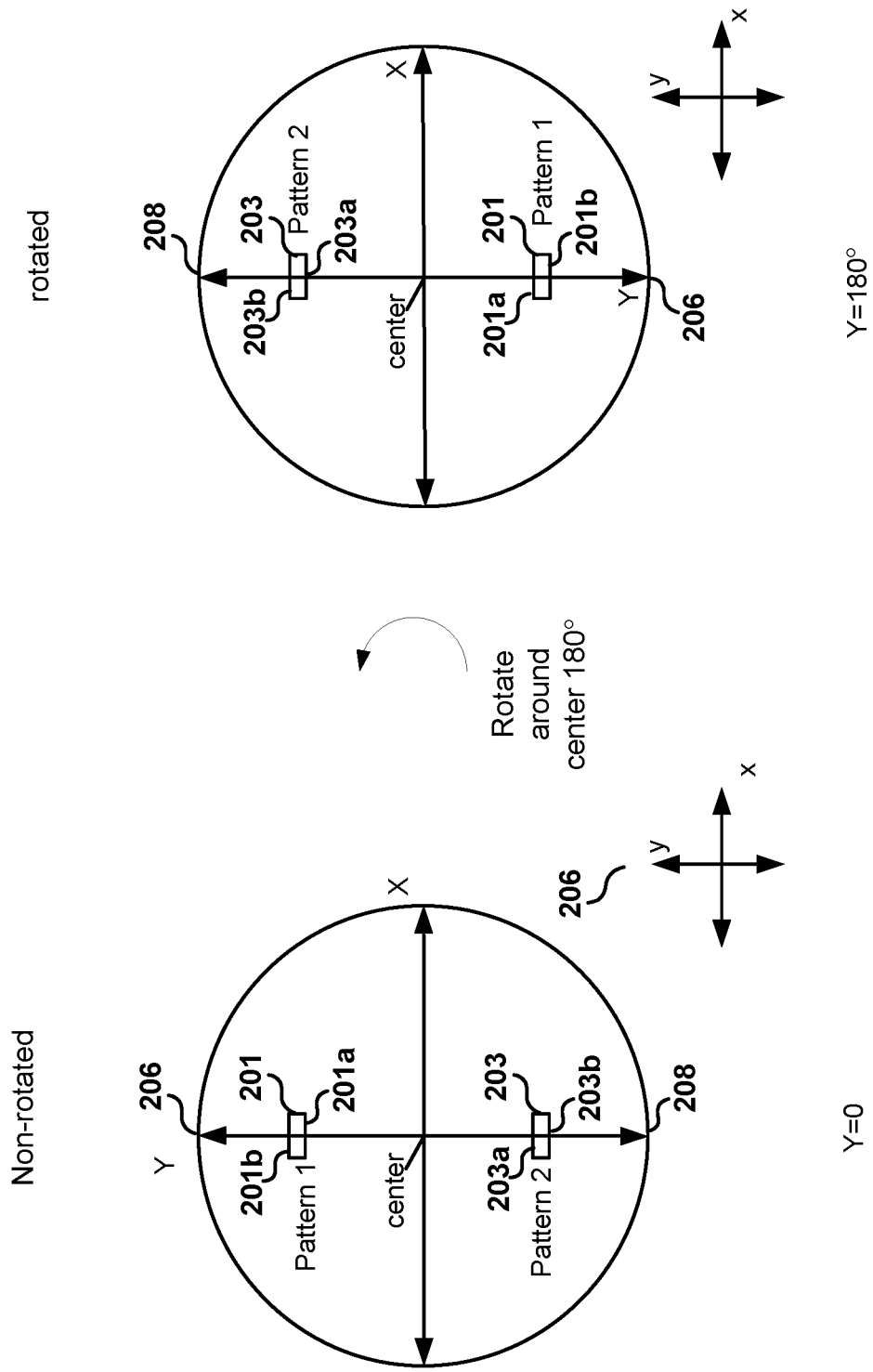
FIG. 3 illustrates a substrate w before and after a rotation of 180°, according to one embodiment.

FIG. 3 shows a substrate w before and after a rotation of 180°. In the non-rotated orientation, the Y-axis of the substrate is collinear with the y-axis of the 2-dimensional space of the plane)(Y=0°. Also, in the non-rotated position, the substrate top 206 has coordinates of (0, +r) and the substrate bottom has coordinates of (0, −r) within the 2-dimensional space of the plane.

In the rotated orientation, the substrate is rotated 180° around its center such that the Y-axis of the substrate is pointing in the −y direction of 2-dimensional space of the plane)(Y=180°. Additionally, once the substrate is rotated, the substrate top is associated with coordinates (0, −r) within the 2-dimensional space of the plane, and the substrate bottom is associated with coordinates (0, +r) within the 2-dimensional space of the plane.

FIG. 4 shows a diagram of an ion beam etching process of a substrate 400 during a high tilt application, according to one embodiment. The substrate 400 is held in place by substrate support 402 and by chuck 406. The chuck 406 is shown to have a rotation axis 404 for subsequent 180° rotations. In the embodiment shown, the substrate 400 is in the non-rotated orientation and is held in place at the non-rotated orientation (e.g., Y=0° during an ion beam etching step (e.g., for anywhere between about 0.1 seconds or less to about 100 seconds or more).

The substrate 400 is shown to be tilted at tilt angle θ that is roughly 45° for illustrative purposes. As noted above, it is contemplated that the substrate may be tilted up to and beyond 85°.

FIG. 4 shows an inductively coupled plasma (ICP) ion source 408 that produces plasma 416 and associated ions for the ion beam 424. The ICP ion source 408 includes a chamber 410 made of quartz or alumina or the like, an electrostatic shield 412, and a radio frequency (RF) coil antennae 414 for producing an RF field. Gas 420 is fed into the chamber and is subject to the magnetic field of the RF field of the RF coil antennae 414, which excites electrons within the gas enough to ionize the gas atoms, thereby creating and sustaining plasma 416. In some embodiments, gas 420 may include noble gases such as Ar, Xe, Ne, or Kr or other gases.

The ICP ion source 408 is also shown to include a grid 418 that is responsible for extracting ions from plasma 416 and propelling them at a defined energy and direction to create ion beam 424. The ion beam 424 is shown to be directed into the ion beam chamber 114 toward the substrate support 402 and the substrate 400. The grid 418 may include two or three or more separate grids having defined hole patterns as well as voltages for creation of the ion beam 424. Individual holes of the grid 418 produce individual ion beamlets that are collimated with other ion beamlets to form the ion beam 424. Individual beamlets may be characterized by a beamlet current that refers to the number of ions passing through the hole per unit time. Individual beamlets are also characterized by beamlet energy density, which refers to the amount of energy carried by the beamlet per unit area.

A divergence 422 (not drawn to scale) is shown to be associated with the ion beam 424. As noted above, divergence 422 may describes imperfect collimation between individual ion trajectories and between individual beamlets, as well as repulsive forces experienced by ions within ion beam 424. In the embodiment shown in FIG. 4A, the ion beam 424 is an isotropic ion beam. That is, the ion beam 424 does not vary significantly in ion beam energy density in any direction of a cross section the ion beam 424. This isotropism of the ion beam 424 is denoted by the equal spacing and uniform density of the arrows pointing out of the grid 418 and toward the substrate 400

The ion beam 424 is shown to make contact with the surface of the substrate 400 at an angle of incidence that is equal to about 90° minus tilt angle θ. As the tilt angle θ is increased to about 85°, as may be the case in some embodiments, the angle of incidence of the ion beam on the substrate 400 becomes close to about 5°. In further embodiments, the angle of incidence may approach 90°.

Again, the ion beam 424 created by ICP ion source 408 and grid 418 is shown to be roughly isotropic across an ion beam cross-section. Thus ion beam's isotropism may be defined by both isotropic ion density of the ion beam and isotropic ion energy density of the ion beam. However, due to divergence 422, the ion density experienced by various regions of the substrate 400 will depend on its distance away from the ICP ion source 408. For example, a region 401 that is tilted closer to ICP ion source 408 will experience an ion beam energy density that is greater than a region 403 that is tilted away from the ICP ion source 408. Curve 426 illustrates an approximate relationship between Y-coordinates of substrate 400 and ion density experienced. The ion density bias toward region 401 (e.g., regions closer to ICP ion source 408) is even more pronounced as tilt angle θ is increased closer to 90°.

As a result of the non-uniform ion beam energy density incident on substrate 400, a non-uniform etch rate of the substrate 400 will occur. For example, region 401 will be etches at a greater rate than region 403.

Enlarged views 432 and 334 show representations of ion beam energy density with respect to horizontal etching at region 403 and region 401 of the substrate 400, respectively. The number or density of arrows is used to denote the energy density of the ion beam incident locally at regions 401 and 403. Enlarged view 432 shows a feature 430 within region 403 that is tilted farther away from ICP source 408. Feature 430 is shown to include a center-facing sidewall 430a and a perimeter-facing sidewall 430b. Enlarged view 434 is for region 401 that is tilted closer to ICP source 408 having a feature 428 with a center-facing sidewall 428a and a perimeter-facing sidewall 428b.

During ion beam etching of substrate 400 (without rotation), feature 430 is shown to experience a relatively small ion beam energy density 424b because feature 430 is in region 403 that is tilted farther away from ICP source 408. In contrast, feature 428 is shown to experience a relatively greater ion beam energy density 424a because feature 428 is in region 401 that is tilted closer to the ICP ion source 408. It should also be noted that during ion beam etching without rotation of substrate 400, sidewalls facing the ICP ion source 408 are etched while sidewalls not facing the ICP ion source 408 are not currently being etched. For example, center-facing sidewall 430a of feature 430 is etched, while perimeter-facing sidewall 428b of feature 428 is etched by ion beam 424. Perimeter-facing sidewall 430b and center-facing sidewall 428a are not etched at this step, but may be etched in a subsequent step after rotating the substrate 400.

Figure 4A:
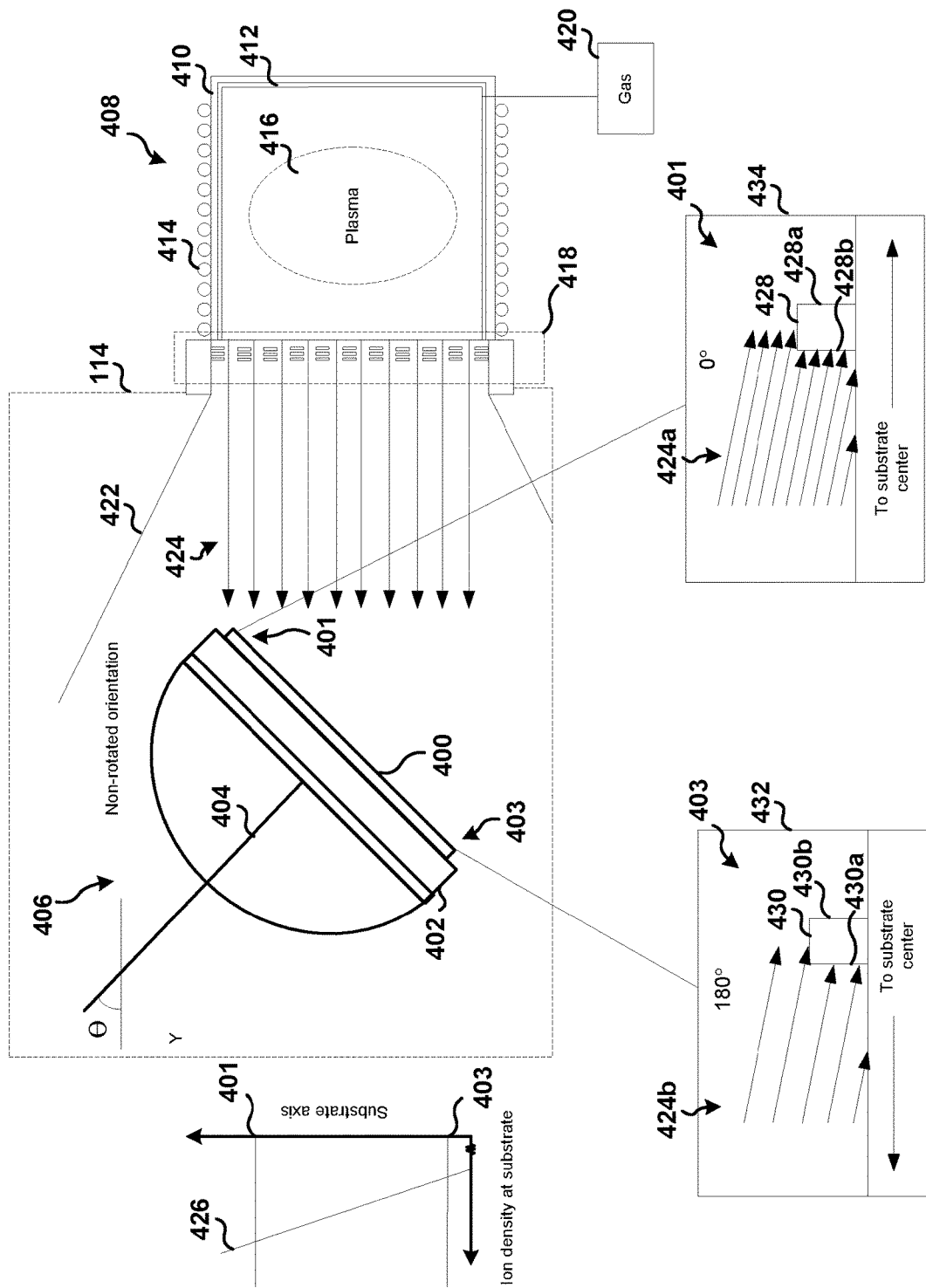
FIGS. 4A and 4B illustrates a diagram of ion beam etching of a substrate that is highly tilted using an isotropic ion beam, according to one embodiment.
Figure 4B:
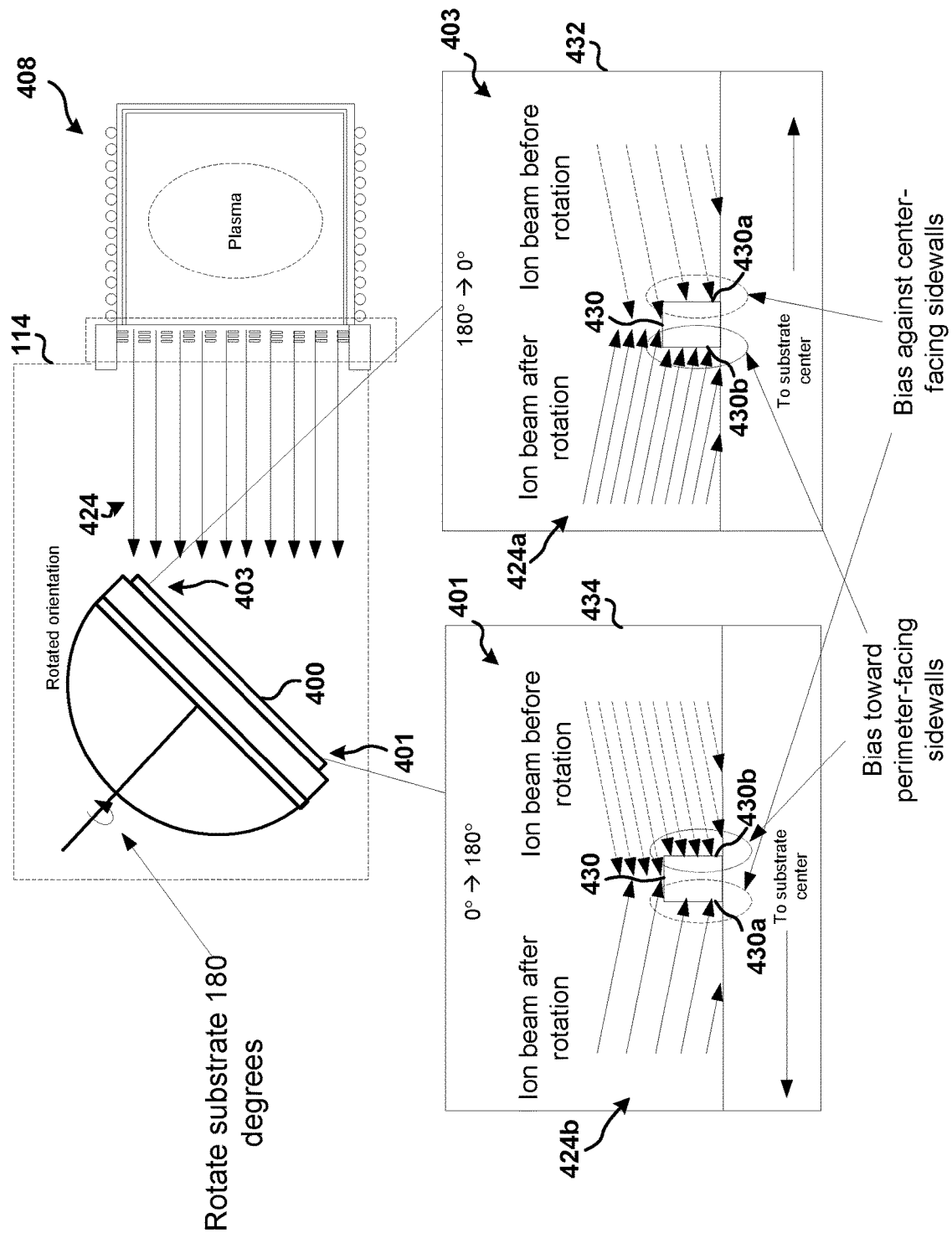

FIG. 4B shows the substrate FIG. 4A during ion beam etching after the substrate has been rotated 180° (e.g., Y=180°. It is contemplated that the ion beam is shut off or suppressed during the 180° rotation. As a result, only etching in the +y and −y directions are performed. Region 401 is shown in FIG. 4B to be tilted farther away from ICP ion source 408, whereas in FIG. 4A region 401 was shown to be tilted closer to ICP ion source 408. Likewise, region 403 is shown in FIG. 4B to be tilted closer to ICP ion source 408, whereas in FIG. 4A region 403 was shown to be tilted farther away from ICP ion source 408. As a result, features of region 401 that experienced relatively greater ion beam energy densities before rotation now experience smaller ion beam energy densities after rotation. Likewise, features of region 403 that experienced relatively smaller ion beam densities before rotation now experience relatively greater ion beam densities after rotation.

Thus, rotating the substrate 400 may more evenly distribute ion beam energy densities experienced at regions having varying Y-coordinates (e.g., improve positional bias etch rate). For example, the average ion beam energy density experienced by region 401 may be made similar to the average ion beam energy density experienced by region 403 by rotating the substrate 400. This assumes that an amount of time associated with etching before rotation and after rotation is roughly the same.

However, ion beam etching involving rotation may not necessarily improve directional bias of etch rate. For example, even with rotation, there is a bias in averaged ion beam energy density (or total ion flux) for horizontal etching that depends on whether a particular sidewall faces the center of substrate 400 (or the center line of substrate) or whether it faces the perimeter (or lines y=±∞) of substrate 400.

For example, enlarged view 434 shows region 401 that has been rotated to an orientation of 180° and initial orientation of 0°. At the orientation of 0° (e.g., before rotation), feature 428 experienced a relatively greater ion beam energy density 424a on its perimeter-facing sidewall 428b indicated by the greater number of dashed arrows. After rotation, feature 428 experiences a relatively smaller ion energy beam density 424b at its center-facing sidewall 428a represented by the smaller number solid arrows.

Enlarged view 432 shows region 401 that has been rotated to an orientation of 0° from a previous orientation of 180°. As shown in FIG. 4A (e.g., before rotation), feature 428 experienced a relatively smaller ion beam energy density 424b on its center-facing sidewall 430a (relatively few dashed arrows). After rotation, feature 430 experiences a greater ion beam density 424a on its perimeter-facing sidewall (greater number of solid arrows).

As a result, although both regions 401 and 403 may be made to experience a similar average ion beam density (or total ion flux) after the substrate 400 is rotated, the ion beam energy density (or total ion flux) is not distributed evenly between sidewalls having differing directionality. That is, center-facing sidewalls of features will experience a consistently smaller ion beam energy densities (or total ion flux) from the ion beam than perimeter-facing sidewalls. This directional bias of ion beam energy density results in a directional bias of etching and etch rate of perimeter-facing sidewalls over center-facing sidewalls. The directional bias may be more prominent for features that are closer to the substrate perimeter and less prominent for features that are closer to the center of the substrate.

Figure 5A:
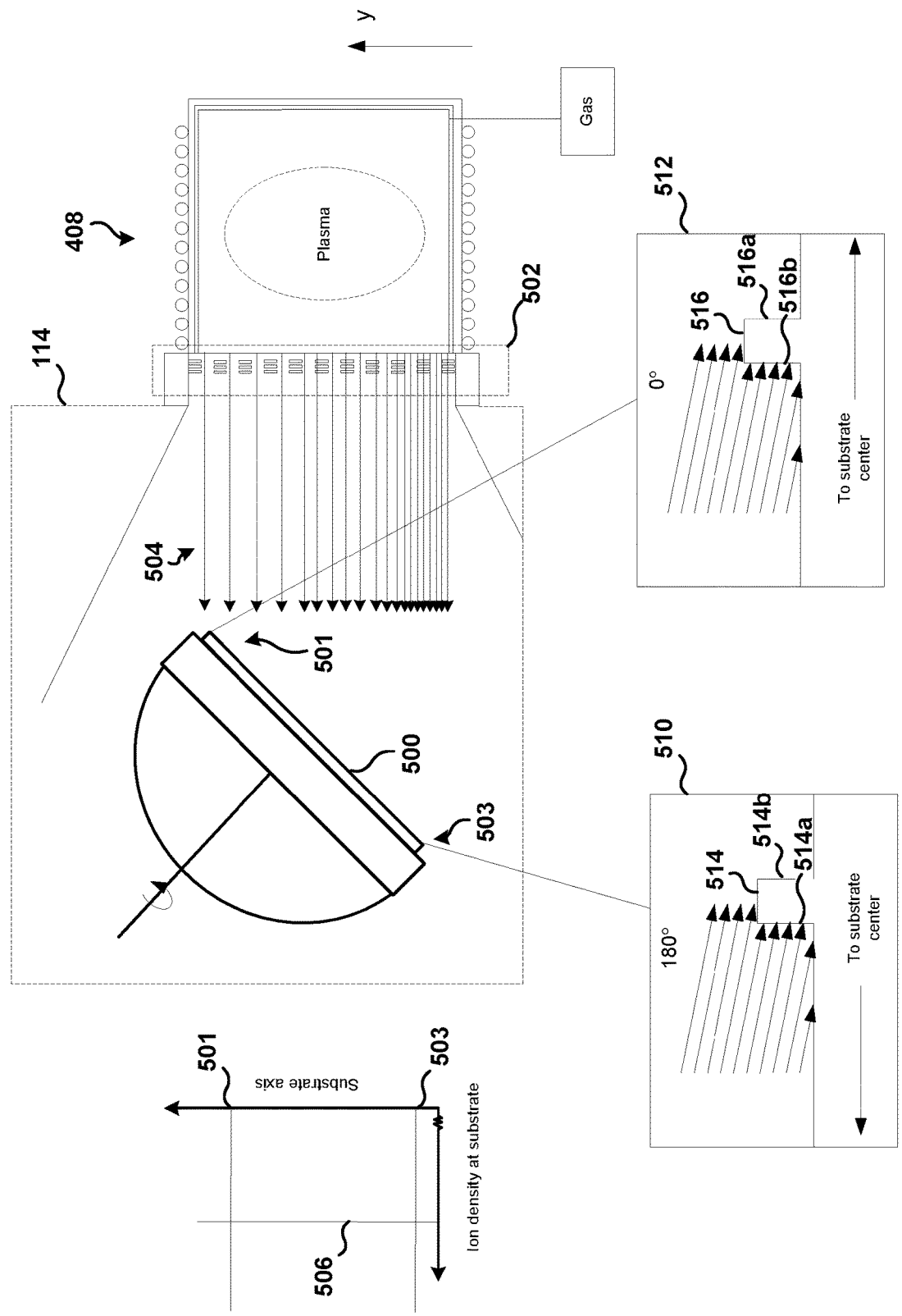
FIGS. 5A and 5B illustrates a diagram of ion beam etching of a substrate that is highly tilted using an anisotropic ion beam, according to one embodiment.

FIG. 5A illustrates ion beam etching of substrate 500 using an anisotropic ion beam 504 having an ion beam energy density gradient defined along a y-axis. The gradient in ion beam energy density is represented by the density of arrows. Regions of the ion beam 504 with more densely spaced arrows indicate a higher ion beam energy density, while regions with less densely spaced arrows indicate a lower ion beam energy density.

For example, the anisotropic ion beam 504, which is enabled by grid 502, has a higher energy density in the negative y direction, and a lower energy density in the positive y direction. As a result, the ion beam energy density experienced by the substrate 500 is uniform along its surface. Curve 506 shows target uniformity in ion beam energy density across the y-axis of the substrate 500 that the grid 502 is able to achieve. Thus, for example, region 501 that is tilted closer (e.g., oriented at 0°) to ICP ion source 408 experiences a similar ion beam density as region 503 (e.g., oriented at) 180° that is tilted farther away from ICP ion source 408.

Expanded view 510 shows a feature 514 in region 503. Expanded view 512 shows a feature 516 in region 501. The ion beam energy density experienced by the center-facing sidewall 514a of feature 514 and the perimeter-facing sidewall 516b of feature 516 is shown to be similar, even though feature 514 is farther away from the ICP ion source 408 than feature 516.

Figure 5B:
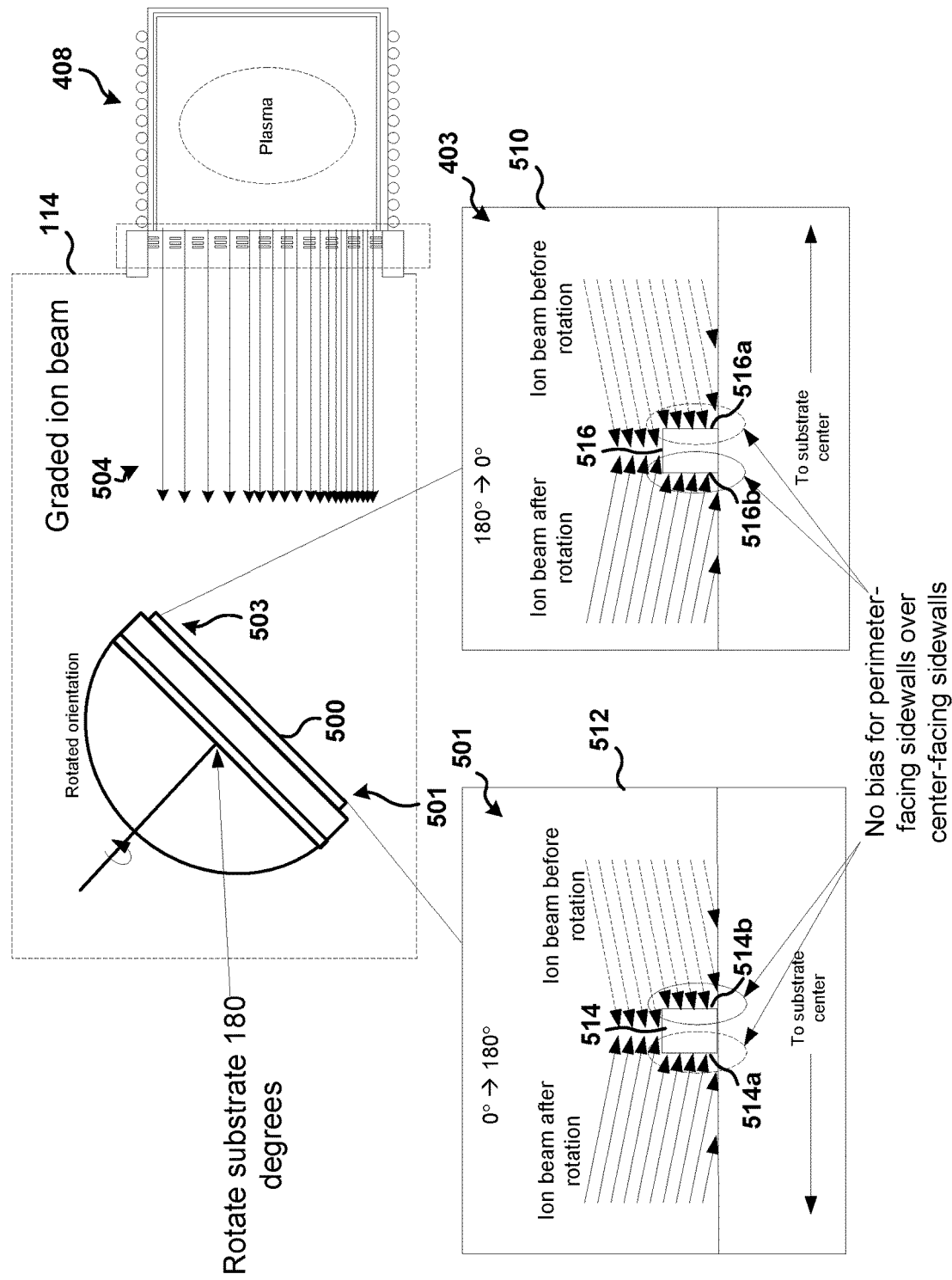

FIG. 5B shows substrate 500 of FIG. 5A being processed with the anisotropic ion beam 504 after the substrate 500 is rotated 180°. As noted above, certain embodiments may have no ion beam etching during rotation. That is, ion beam etching only occurs when the substrate is either in a non-rotated (e.g., Y=0° or a rotated (e.g., Y=180° orientation. As a result, ion beam etching is to occur in the +y or −y directions in some embodiments.

After the substrate 500 is rotated 180°, region 501 is now oriented at 180°, and region 503 is now oriented at 0°. Expanded view 512 shows feature 514 of region 501 that was first processed by the ion beam in the 0° position before rotation and is processed in the 180° orientation after rotation. Again, the ion beam energy density experienced by the center-facing sidewall 514a of feature 514 is shown to be similar to the ion beam energy density experienced by the perimeter-facing sidewall 516b of feature 516. Thus, the average ion beam energy density (or total ion flux) is made uniform even between locations on the substrate 500 that are tilted closer or farther away from the ICP ion source 408. This demonstrates improvement upon positional bias of etch.

Moreover, feature 514 is shown to experience a similar ion beam energy density (solid lines) on its center-facing sidewall 514a as it did on its perimeter-facing sidewall 514b before rotation (dashed lines). Likewise, feature 516 in expanded view 510 is shown to experience a similar ion beam density (solid lines) on its perimeter-facing sidewall 516b as it did on its center-facing sidewall 516a (dashed lines). As a result, there is no longer an ion beam density bias towards perimeter-facing sidewalls that was seen in FIG. 4B due to isotropic ion beam etching. This demonstrate improvement to directional bias of etch. It is noted that features 514 and 515 are representative and shown for illustrative purposes and are not drawn to scale. Moreover, there may be any number of features existing on substrate 500 for etching.

Figure 6:
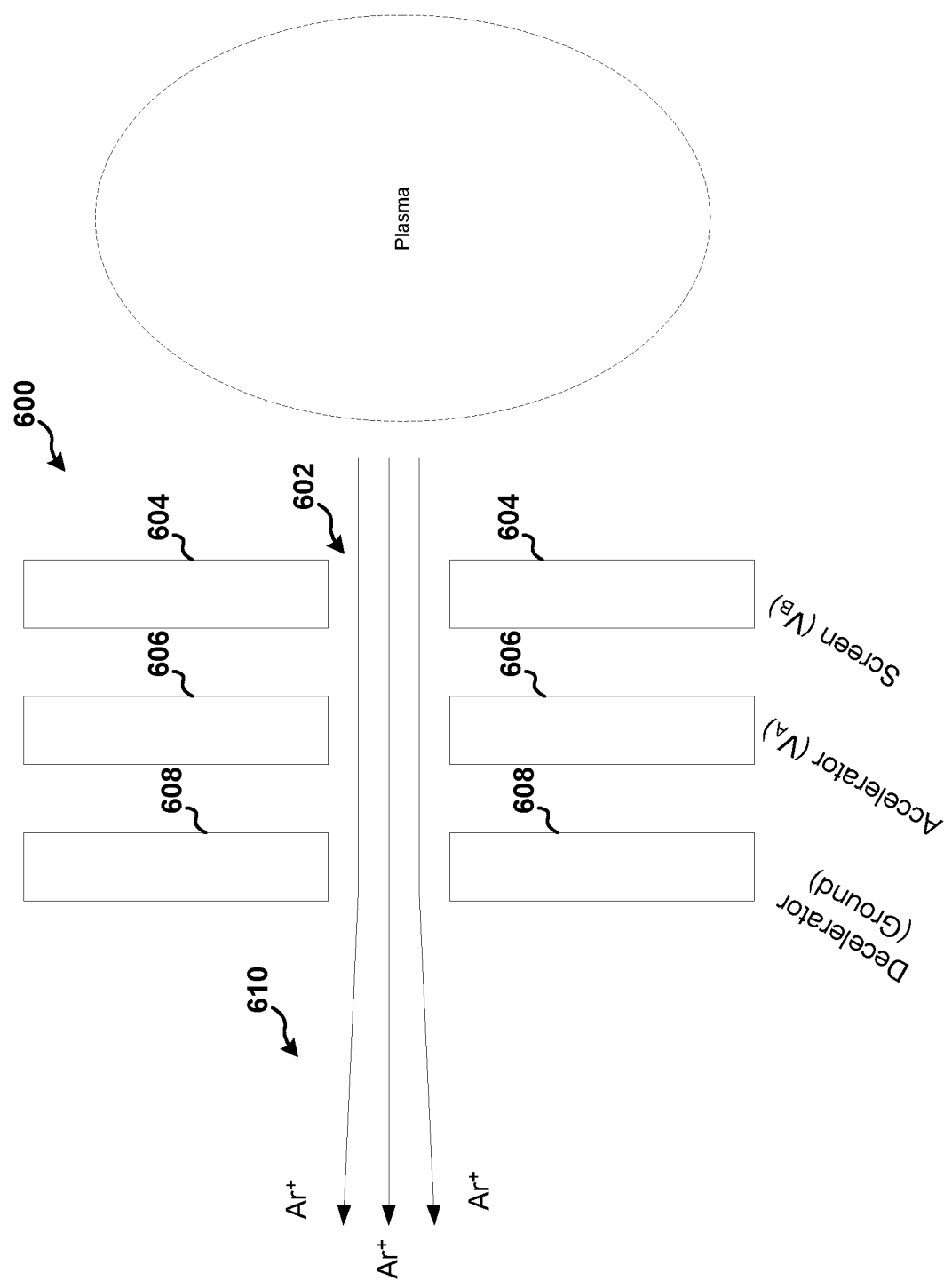
FIG. 6 illustrates a cut-away view of a grid system that may be used with various embodiments discussed herein, according to one embodiment.

FIG. 6 shows a cut-away view of an exemplary grid 600 that may be used to extract and propel ions from an ICP ion source to create an ion beam. The grid 600 is shown to include a screen 604 portion, an accelerator 606 portion, and a decelerator 608 portion. The screen 604 (also known as a shield) is set at a positive potential $V_B$ relative to ground, while accelerator 606 is set to a negative potential $V_A$ and decelerator 608 is set to ground. The voltage $V_B$ of the screen 604 generally determines the ion beam energy.

The grid 600 also includes a plurality of holes, with hole 602 being shown. Positive ions are extracted from the plasma through the hole 602 in the grid 600 and accelerated by accelerator 606 and subsequently decelerated by decelerator 608. The final energy of ions extracted through hole 602 will be around the voltage of the screen 604, $V_B$.

In supporting creation of an anisotropic ion beam having an energy density gradient that vary across an axis, for example, the y-axis, a number of improved grids are envisioned. Certain embodiments illustrated in FIGS. 7A-C, 8A-C, and 9A-D are able to produce an anisotropic ion beam having an energy gradient that varies within a cross section of the ion beam.

Figure 7A:
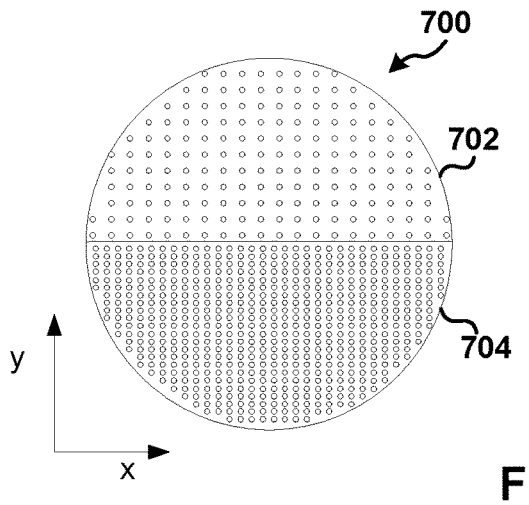
FIGS. 7A-7C illustrate embodiments of grid systems that are defined by sections have different extraction hole densities, enabling an anisotropic ion beam to be produced having a gradient in ion density across an axis.
Figure 7A:
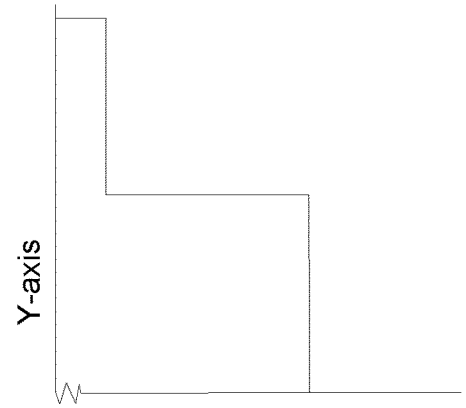

For example, FIG. 7A shows a grid 700 having a first section 702 and a second section 704, where the first section 702 is associated with a lesser hole density than the second section 704. Hole density refers to the a number of holes per unit area defined in the grids. The hole density is shown to be dependent on the y-coordinate of the grid in the associated graph. Also, according to the embodiments of FIGS. 7A-7C, the hole size is constant while the hole density varies. Further, it is shown that the hole density is constant across a width of the grid. The width, when varies across the y-axis defines a plane that the grid lies in. Thus, varying hole density along the y-axis or in the y direction is taken to mean that a width of the grid varies along the y-axis.

According to some embodiments, there is a positive correlation between hole density and the resulting ion beam energy density that is extracted through the holes. In some embodiments, increasing hole density is contemplated to correspondingly increase ion density of a resulting ion beam. As a result, grid 700 is to produce an anisotropic ion beam having a greater ion density in the negative y direction and a lesser ion density in the positive y direction.

Figure 7B:
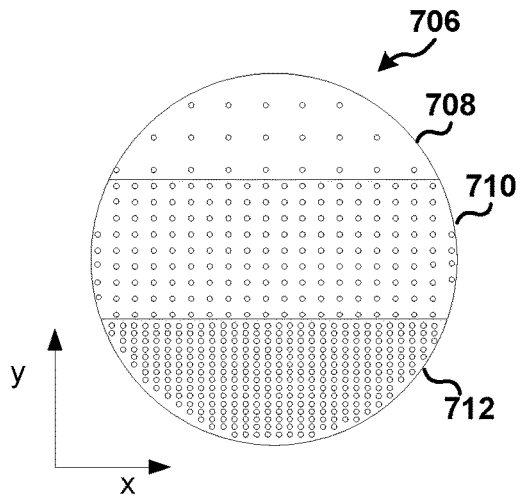
Figure 7B:
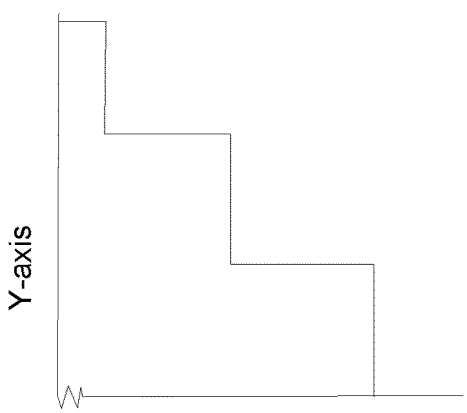

In FIG. 7B, a grid 706 is shown to have a first section 708, a second section 710 and a third section 712. The hole density of the third section 712 is shown to be greater than the hole density of the second section 710, which in turn is greater than the hole density of the first section 712. The resulting ion beam produced by grid 706 it contemplated to have an ion density that decreases as y becomes more positive. For example, the ion density produced by the first section 708 will be less than that of the second section 710, which in turn is less than that of section 712. As noted above, there is a positive correlation between hole density and ion beam density, where other parameters such as hole size remain similar.

Figure 7C:
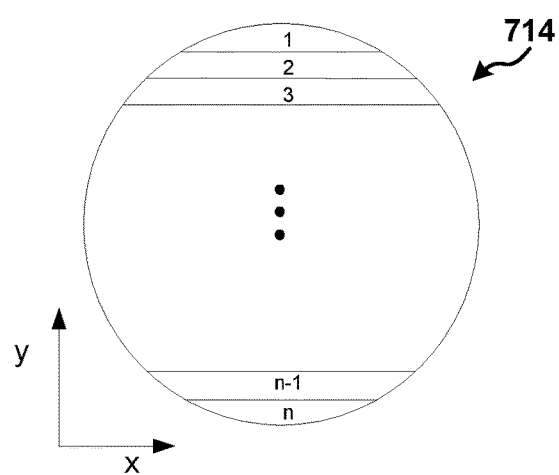
Figure 7C:
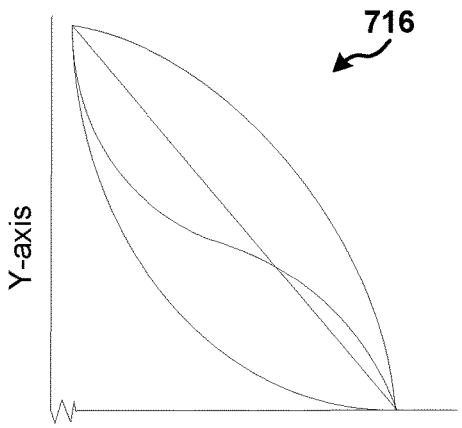

In FIG. 7C, a grid 714 is shown to have n sections. Each section may be defined by a different hole density. It is envisioned that n may be anywhere between 2 and about 100 or more. The contemplated relationships between hole density and the y-axis of the grid is shown in graph 716. For example, it is contemplated that hole density may decrease linearly as y becomes more positive. In other embodiments, hole density may decrease logarithmically, exponentially, or in a sigmoidal manner as y becomes more positive. In other embodiments, the hole density gradient along the y-axis will be determined based on optimization techniques and tuning of the resulting anisotropic ion beam, and may take on a relationship that is not shown in FIG. 7C. Moreover, the precise hole density gradient with respect to the y-axis will depend on the size of the substrate and the tilt angle of the substrate. For example, a more pronounced hole size gradient may be used for ion beam etching applications involving a greater amount of tilt of the substrate. In various embodiments, the hole density may range anywhere between fewer that $10^{-3}$ holes/mm$^2$ and greater than about $10^3$ holes/mm$^2$. It is also to be noted that none of FIG. 7A, 7B, or 7C are drawn to scale.

Figure 8A:
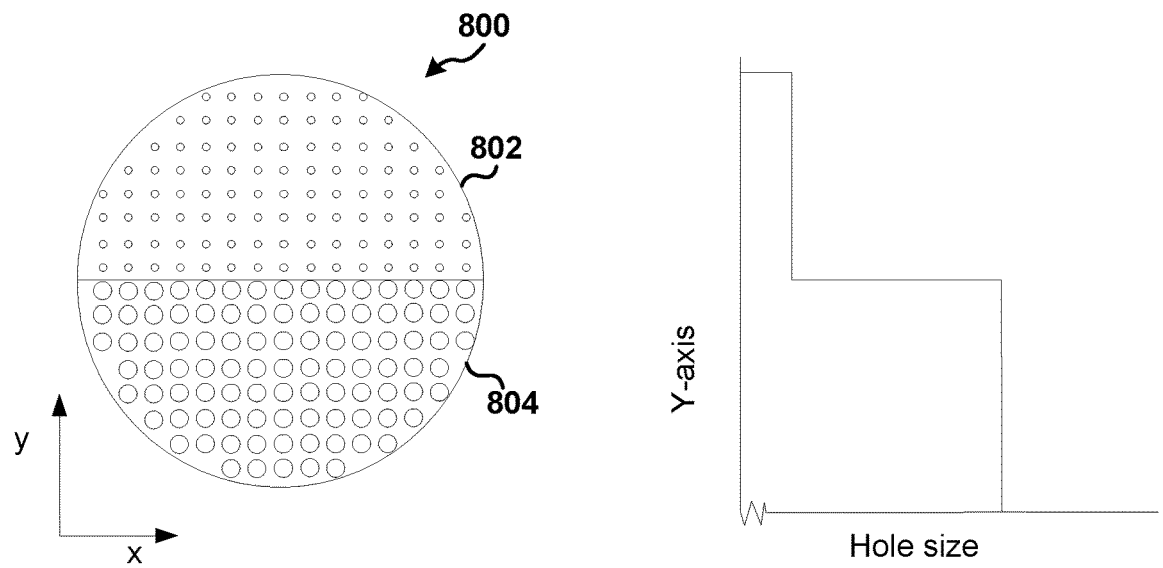
FIGS. 8A-8C illustrate embodiments of grid systems that are defined by sections have different extraction hole sizes, which enable an anisotropic ion beam to be produced having a gradient in ion density across an axis.
Figure 8B:
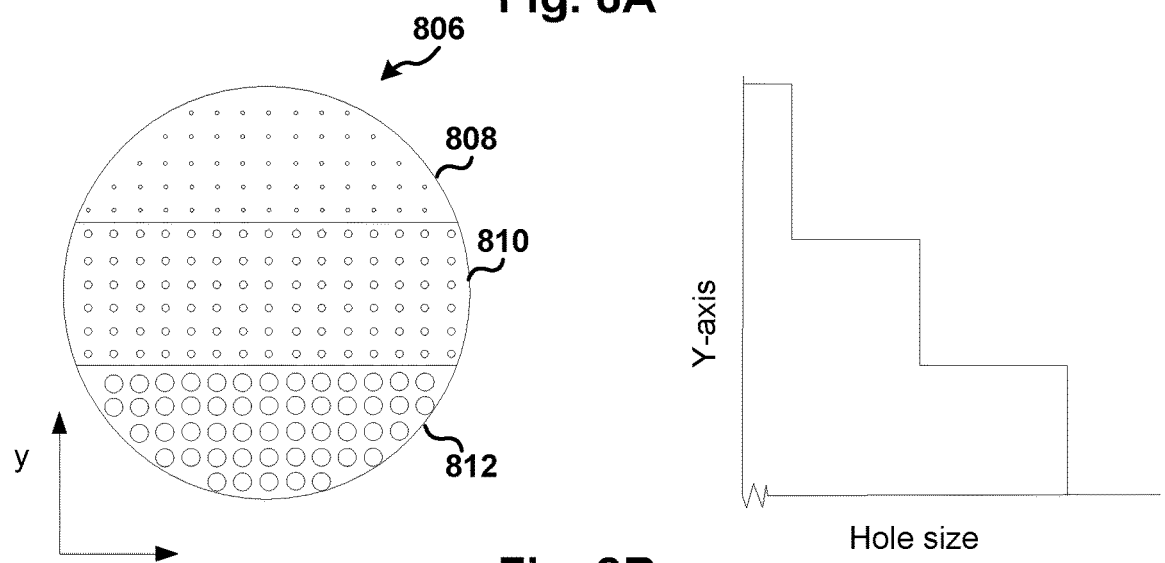
Figure 8C:
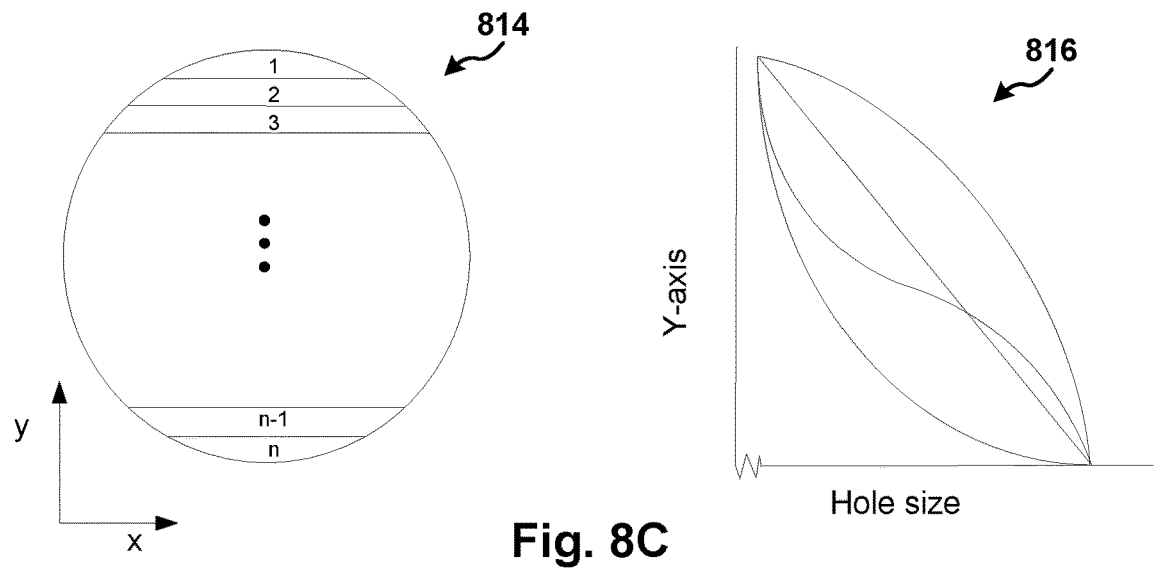

According to the embodiments shown in FIGS. 8A-8C, hole density is kept constant while hole size is varied in the y-axis. In various embodiments, there is a positive correlation between hole size and resulting ion beam density. For example, larger extraction holes are associated with large beamlet currents, which will result in higher ion densities. As a result regions of a grid having larger extraction holes will create greater ion beam densities than regions of a grid having smaller extraction holes, with other parameters remaining similar. FIG. 8A shows a grid 800 having a first section 802 with smaller holes than that of the second section 802. Grid 800 will produce an ion beam that has a greater ion density in the ion beam's bottom half and a smaller ion density in the ion beam's top half due to the larger hole size of the second section 804 compared to the first section 802.

FIG. 8B shows a grid 806 with a first section 808, a second section 810, and a third section 812. The hole density is shown to be constant across the three sections. However, the first section 808 is shown to be defined by a smaller hole size than the section 810, which in turn is shown to be defined by a smaller hole size than the third section 812. As a result, an ion beam produced by grid 806 will have a top third that has a lesser ion density than the middle third, which in turn has a lesser ion density than the bottom third. Thus, the ion beam extracted by grid 806 will be anisotropic in ion density in the y-direction, and have an ion beam energy density gradient in y.

FIG. 8C illustrates a grid 814 that is an extension of the principles applied in FIGS. 8A and 8B. Grid 814 is shown to be sectioned along the y-axis into n sections. It is contemplated that n may be anywhere between 2 and about 100 or greater depending on various embodiments. In some embodiments, n may be greater than $10^4$. Each section of the n sections may be defined by a different hole size such that the hole size decreases as the y coordinate increases. In various embodiments, the relationship between the hole size decreasing as y coordinates increases may be described by a linear decrease, an exponential decrease, a logarithmic decrease, or a sigmoidal decrease. In practice, the relationship between hole size and the y-coordinate will depend upon many factors, and may not follow one of the relationships shown in graph 816. As noted above, the target gradient of the anisotropic ion beam will depend upon various factors including the tilt of the substrate, the size of the substrate, the plasma source, and various etching parameters.

It is to be noted that none of FIGS. 8A-8C are drawn to scale. Instead, FIGS. 8A-8C are drawn for illustrative purposes that show how varying hole size along the y-axis of a grid for extracting and accelerating ions during ion beam etching enables anisotropic ion beams. It is also noted that in each of grids 800, 806, and 814 may include two or three separate grids that are stacked on top of one another. For example, each of the aforementioned grids are interpreted to include, for example, a screen grid at a voltage $V_B$, an accelerator grid at voltage $V_A$, and a decelerator grid at ground. Each grid will share the same hole profile in terms of hole position, hole size, and hole density in some embodiments.

Although FIGS. 7A-7C show constant hole size with varying hole density, and FIG. 8A-8C show varying hole size with constant hole density, it is also contemplated that varying hole density and varying hole size may be used in combination to create desired ion beam energy density gradients having locally defined ion beam energies. For example, in some embodiments, a grid may have hole size and hole density decrease as y increases, although the rate or manner of decrease in hole size or hole density may be different.

FIGS. 9A-9D illustrate grids having sections that are supplied with different voltages that may enable ion beams that are anisotropic in energy density. For example, grid 900 is shown to include a first section 902 at voltage $V_0$, a second section 904 at voltage $V_1$, and a third section 906 at voltage $V_2$. It is contemplated that by manipulating the voltage of the screen grid of grid 900 (see FIG. 6) the energy associated with ions extracted from the adjacent plasma may be controlled. As noted above, the voltage supplied to the screen grid is proportional to the beam energy. If the voltage of the screen grid is increased in a certain region of the grid, the resulting beam energy is increased. Lowering screen grid voltage correspondingly lowers beam energy.

Here, ion sources are contemplated to be used with sectional grids that allow for local manipulation of voltage to control a resulting ion beam energy density gradient. In some embodiments, the sectional grids may be used to correct for non-uniformities of substrate features caused by prior and/or future processing steps. As a result, the sectional grid contemplated here may be tuned to deliberately cause non-uniform etching on a substrate in order to counteract or preempt prior or future non-uniform fabrication processes such that a more uniformly processed (etched) substrate results. As a result, grids that provide non-uniform etching for a substrate are contemplated here in addition to grids that provide more uniform etching across a substrate. Certain grids envisioned here (FIGS. 9A-9D) are enabled to do both. That is, sectional grids that are locally controllable for voltage are enabled, for example, to deliver a non-uniform etching across a plane of the substrate in one processing step, as well as uniform etching across the plane of the substrate in a different step. This is because sectional grids contemplated here are enabled to deliver ion beams having different cross sectional profiles for energy density between steps due to an ability to manipulate the voltage of each of the sections of the sectional grid.

The non-uniformities may be due to positional and/or directional bias of processing on the substrate, as well as other biases associated with a processing instrument. Moreover, the non-uniformities may originate from processes related to deposition, removal or etching or milling or sputtering, patterning, or other substrate processing operation.

For prior non-uniformities caused by previous processing steps, it is contemplated that the non-uniformities may be measured and/or calculated in order to determine a cross-sectional profile of ion beam energy density that is to be used to compensate for the non-uniformities. In such embodiments, the resulting ion beam energy density gradient is to make more uniform a non-uniformly processed substrate.

In other embodiments, the sectional grids contemplated here may be tuned to deliberately produce non-uniform etch rates across the substrate in order to compensate ahead of time for a future non-uniform processing step. In these embodiments, future non-uniformities may be predicted in order to determine a cross sectional profile of ion beam energy density that is to be used to preemptively compensate for the future non-uniform processing steps. In such embodiments, the resulting ion beam energy density gradient is specified to "deliberately" make a non-uniformly etched substrate to match a future non-uniform process that results in a more uniformly processed substrate.

Thus, it is contemplated that the first section 902 has a voltage that is less positive than that of the second section 904, which in turn is less positive than that of the third section 906 ($V_0<V_1<V_2$). The resulting ion beam will be anisotropic for beam energy in y. Specifically, a cross section of the resulting ion beam will have a top third will lower ion energies (e.g., slower traveling ions), a bottom third with higher ion energies (e.g., faster traveling ions), and a middle third with in-between ion energies (in-between ion velocities). As a result, a grid such as grid 900 may provide an anisotropic ion beam having a gradient of ion energies in y that may provide more uniform etching rates for tilted substrates. It is noted that each of the three sections 902, 904, and 906 may be electrically insulated from one another.

Figure 9A:
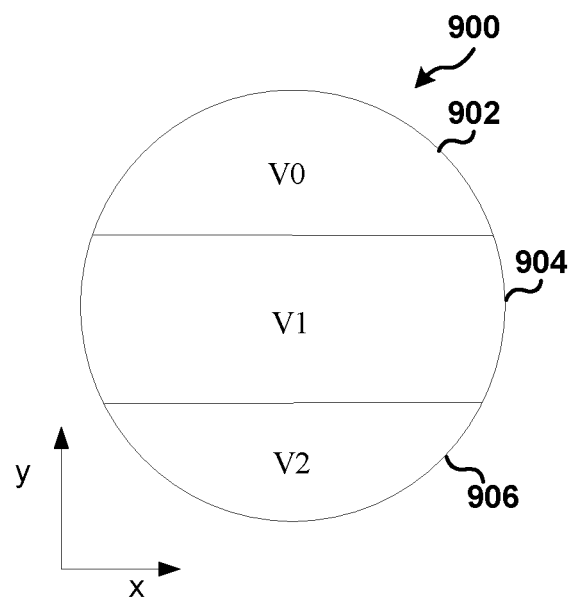
FIGS. 9A-9D illustrate embodiments of grid systems that are defined by sections supplied with different voltages, which enable an anisotropic ion beam to be produced having a gradient in ion density across one or more axes.
Figure 9B:
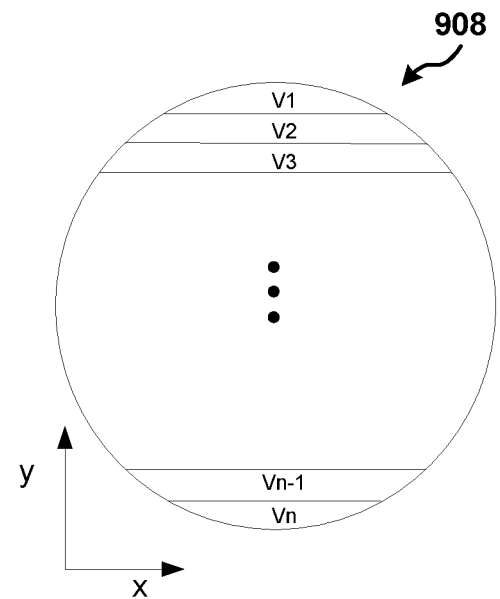

FIG. 9B shows a grid 908 that is an extension of the principles illustrated in FIG. 9A. Grid 908 includes n sections, each of which may be supplied with a different voltage. As noted above, the voltage that is manipulated may be the screen voltage $V_B$. However, in other embodiments, the voltage of the accelerator and the decelerator may be manipulated in addition or instead of the screen voltage. In FIG. 9B, it is contemplated that the voltages of each section are to decrease as the y-coordinate increases. That is, $V_1$ is to be lower (less positive) than $V_2$, which is lower than $V_3$, which is lower than which is lower than $V_n$. It is contemplated that n may be anywhere between 2 and more than about 1000. The relationship between the voltage and the y-axis will depend upon a number of factors. In some embodiments, the increase in voltage as the y-coordinate decreases may be non-linear. In other embodiments, the increase in voltage with respect to the y-axis may be linear or quasi-linear.

Figure 9C:
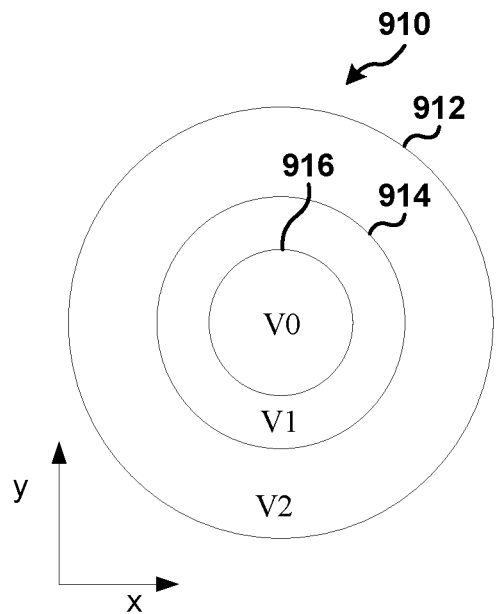

FIG. 9C shows an embodiment of a grid 910 having radially defined sections 912, 914, and 916. Each of the radially defined sections 912, 914, and 916 may have different voltages for $V_0$, $V_1$, and $V_2$. The resulting ion beam formed by grid 910 may have an energy gradient that is defined radially. For example, if $V_0>V_1>V_2$, then the resulting ion beam will have a gradient of ion energy that is biased (e.g., decreases) as radial distance increases. For example, a portion of the ion beam originating from section 912 will have a greater energy than a portion of the ion beam originating from section 9016. On the other hand, if $V_0<V_1<V_2$ for grid 910, the resulting ion beam will have a gradient of ion density that is biased toward the perimeter of the grid 910. Grids such as grid 910 that are capable of producing radially defined energy gradients of ion beam energy density may be useful in both tilted substrate and non-tilted substrate ion beam etching applications.

Figure 9D:
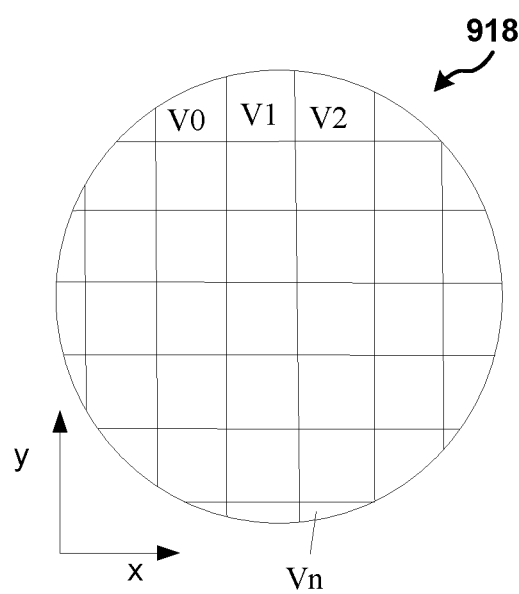

FIG. 9D shows a grid 918 with an array of n sections. Each section may be independently controlled for voltage such that a voltage gradient across one or both of the x and y-axes is provided. Grid 918 further illustrates how voltage of a grid is envisioned to be controlled. It is contemplated that the voltage for any particular region may be controlled locally to create anisotropic ion beams with energy gradients that are finely controllable in x and in y. The number of sections n is envisioned to be anywhere between 2 and about $10^6$ or more, depending on various embodiments.

In some embodiments, it is contemplated that the number of sections n may equal the number of extraction holes such that each hole may have a separately definable voltage (e.g., screen voltage). As a result, the beamlet energy for each ion beamlet energized out of each extraction hole may be individually defined.

It is also contemplated that the use of grids defined by different sections having different voltages may be implemented with the sections having different hole sizes and/or different hole densities. For example, grid 908 may be implemented such that the section defined by voltage $V_n$ is associated with a larger extraction hole size and/or a greater hole density than the section defined by voltage $V_{n-1}$ and so on. The larger hole size and/or greater hole density may complement the higher voltage of $V_n$ to increase the likelihood that a given ion existing in plasma will have a permissible trajectory to traverse the screen.

It is contemplated that the grid embodiments shown in FIGS. 7A-7C, 8A-8C, and 9A-9D are planar and defined vertically by a y-axis and horizontally by an x-axis. In some embodiments, sections of these grids may be defined such that they extend horizontally across a width of the grid system.

Figure 10:
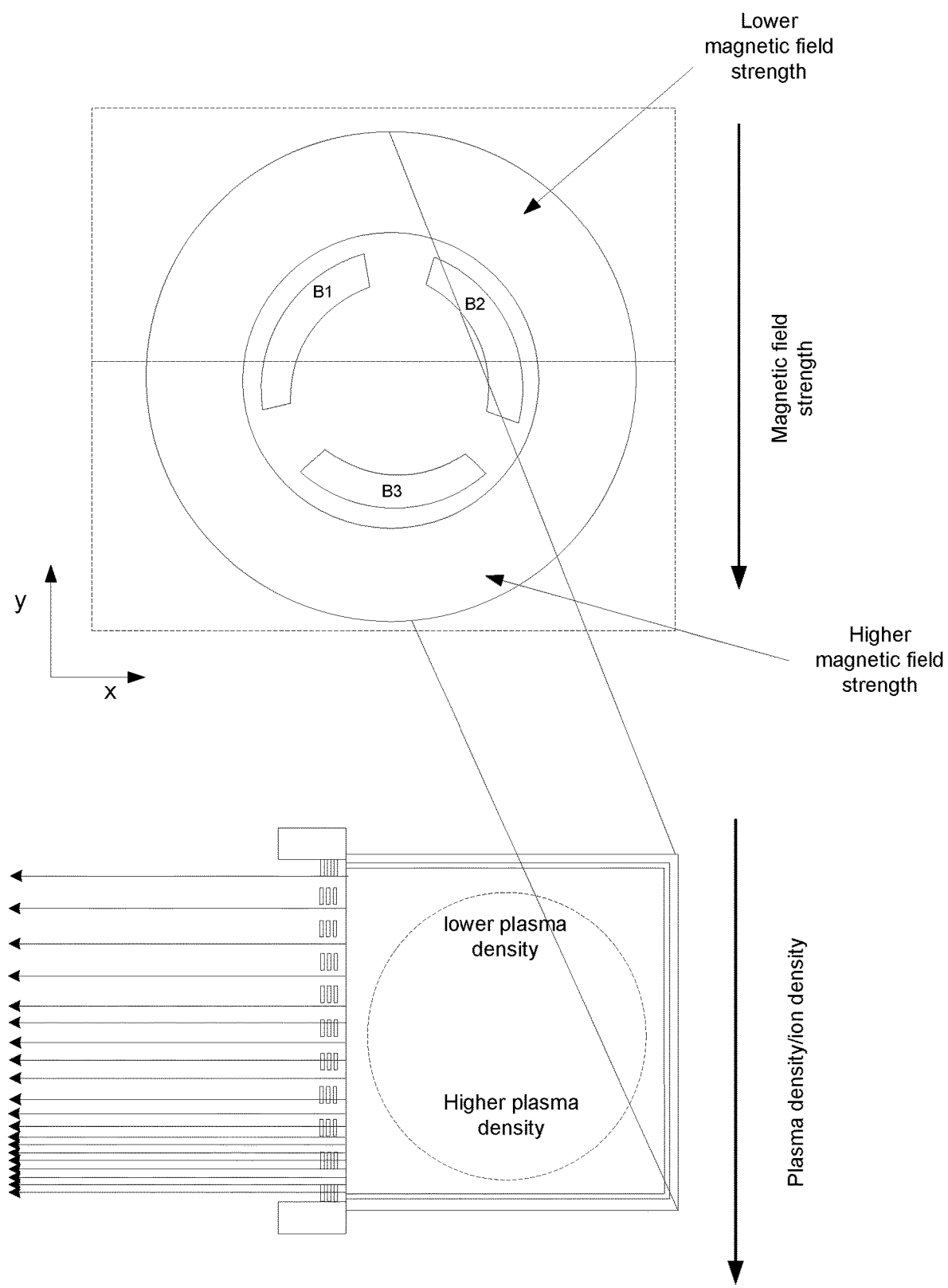
FIG. 10 illustrates an additional embodiment of an inductively coupled plasma ion source having a sectional magnetic field that may be used to produce an anisotropic ion beam having a gradient in ion density.

FIG. 10 illustrates an additional embodiment of an inductively coupled plasma ion source having a sectional magnetic field provided by magnetic field sections B1, B2, and B3 that may be used to produce an anisotropic ion beam having a gradient in energy density. The magnetic field sections B1, B2, and B3 may be a part of a toroidal or half-toroidal field that produces a magnetic field that is locally defined by the magnetic sections. Magnetic field sections may be disposed inside the plasma chamber of the ion source, inside the wall of the plasma chamber, or outside the plasma chamber. In one embodiment, the magnetic field sections B1, B2, and B3 may be disposed toward the back side of the plasma chamber.

The resulting magnetic field is greater in the negative y direction than the positive y direction. As a result, the plasma produced may have a greater electron density in the negative y direction than the positive y direction. Because plasma is sustained at greater electron densities in the negative y direction, the resulting ion beam will likewise have a greater energy density in the negative y direction than the positive y direction. As a result, an anisotropic ion beam may be produced having a greater energy density in the negative y direction and having a smaller density in the positive y direction. The sectional magnetic field produced by B1, B2, and B3 may be implemented in addition to the RF coil antennae to enhance the magnetic field locally within the ion source, for example, toward the negative y direction of the ion source.

It is contemplated that sectional magnetic fields may be used to locally modify the magnetic field experienced by the plasma of an inductively coupled plasma ion source to manipulate the resulting ion beam energy density gradient. Sectional magnetic fields may be positioned or configured such that certain regions of the ion source cavity experience greater magnetic field strength to create a greater degree of ionization in that specific region compared to other regions of the ion source cavity. As a result, it is contemplated that the ion source may be tuned with sectional magnetic fields to local manipulate magnetic field strength such that the energy density gradient of the resulting ion beam may be controlled.

Figure 11A:
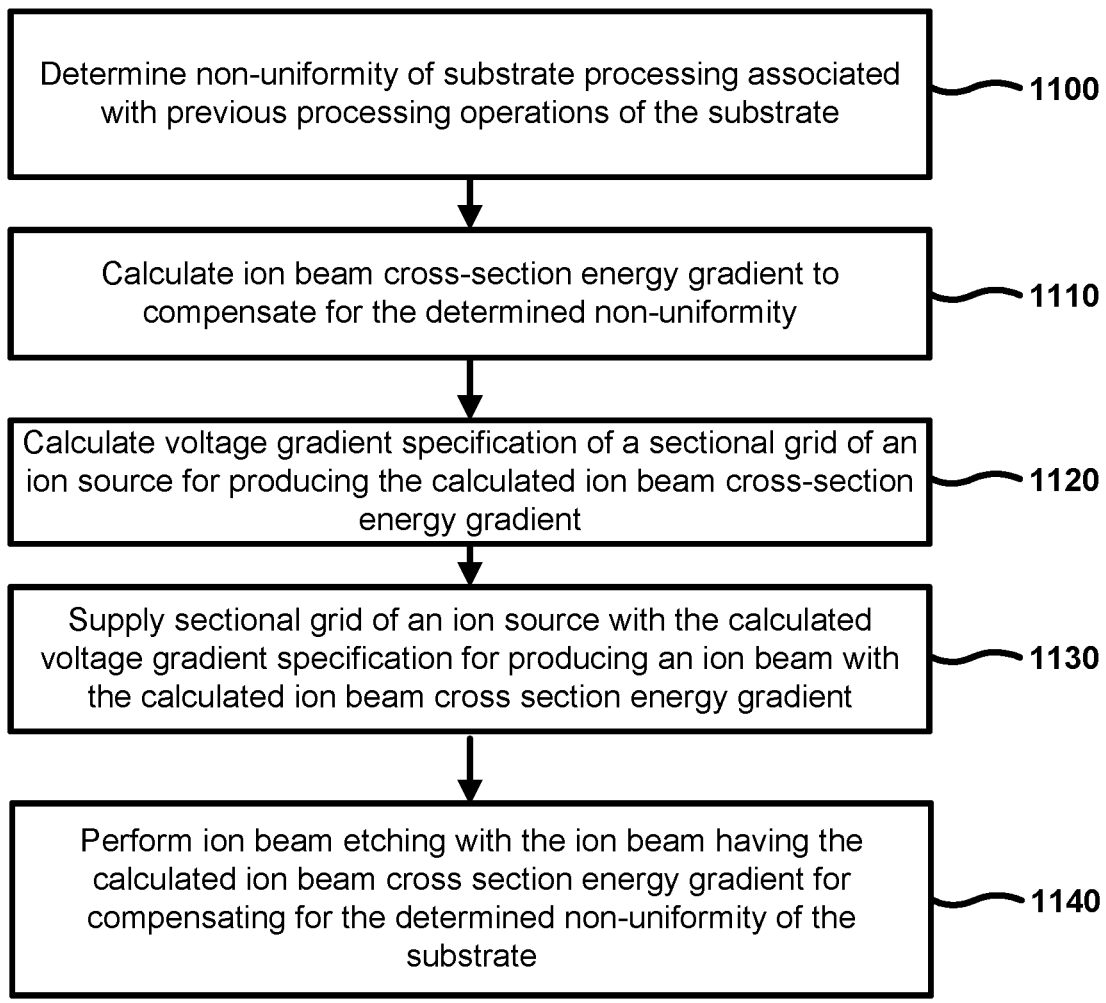
FIGS. 11A and 11B show an overall flow for methods of processing a substrate with ion beam etching with an ion source having a sectional grid that can be controlled locally for voltage.

FIG. 11A illustrates an overall flow for a method of using a sectional grid that can be locally controlled for voltage to achieve uniform etching of a substrate. The method include an operation 1100 for determining non-uniformity of substrate processing associated with one or more prior processing operations of the substrate. The prior processing operations may include one or more of a deposition step, an etching step, or a patterning step, or other substrate processing step. The method contemplates measuring the non-uniformity, calculating the non-uniformity, or referring to prior measurements of non-uniformity.

Depending on the determined non-uniformity of substrate processing, the method contemplates an operation 1110 that calculates an ion beam cross-section energy gradient that will compensate for the determined non-uniformity. For example, it may be determined that the ion beam should have an energy gradient across its cross section such that a one region of the cross section is defined by a greater energy density than another in order to achieve greater uniformity. Operation 1120 of the method calculates a voltage gradient specification for the section grid that is to achieve the desired ion beam energy density gradient. The method then flows to operation 1130, which serves to supply the sectional grid of an ion source with the calculated voltage gradient specification for producing the ion beam with the ion beam energy density gradient.

The voltage gradient is made possible by the sectional grid having a plurality of sections that can be defined individually for a particular desired voltage. As a result, any number of energy density gradients for ion beam etching may are enabled by the methods and systems presented here. As noted above, in certain embodiments, there may be as many voltage-defined sections as there are holes on the sectional grid. In those embodiments, every beamlet for each of the holes on the sectional grid may be individually definable for beamlet energy. In these embodiments, every section is to have one ion extraction hole from which the resulting beamlet may be individually defined in energy by defining the voltage of that particular section. As a result, it is contemplated the method and systems presented here are enabled to control the beam energy density gradient down to individual beamlets.

In operation 1140, the substrate having a non-uniformity is subject to the ion beam of operation 1140, thereby compensating or matching the determined non-uniformity of the substrate from previous steps. Thus the method shown in FIG. 11A is enabled to achieve substrate uniformity based on a detected or calculated non-uniformity.

Figure 11B:
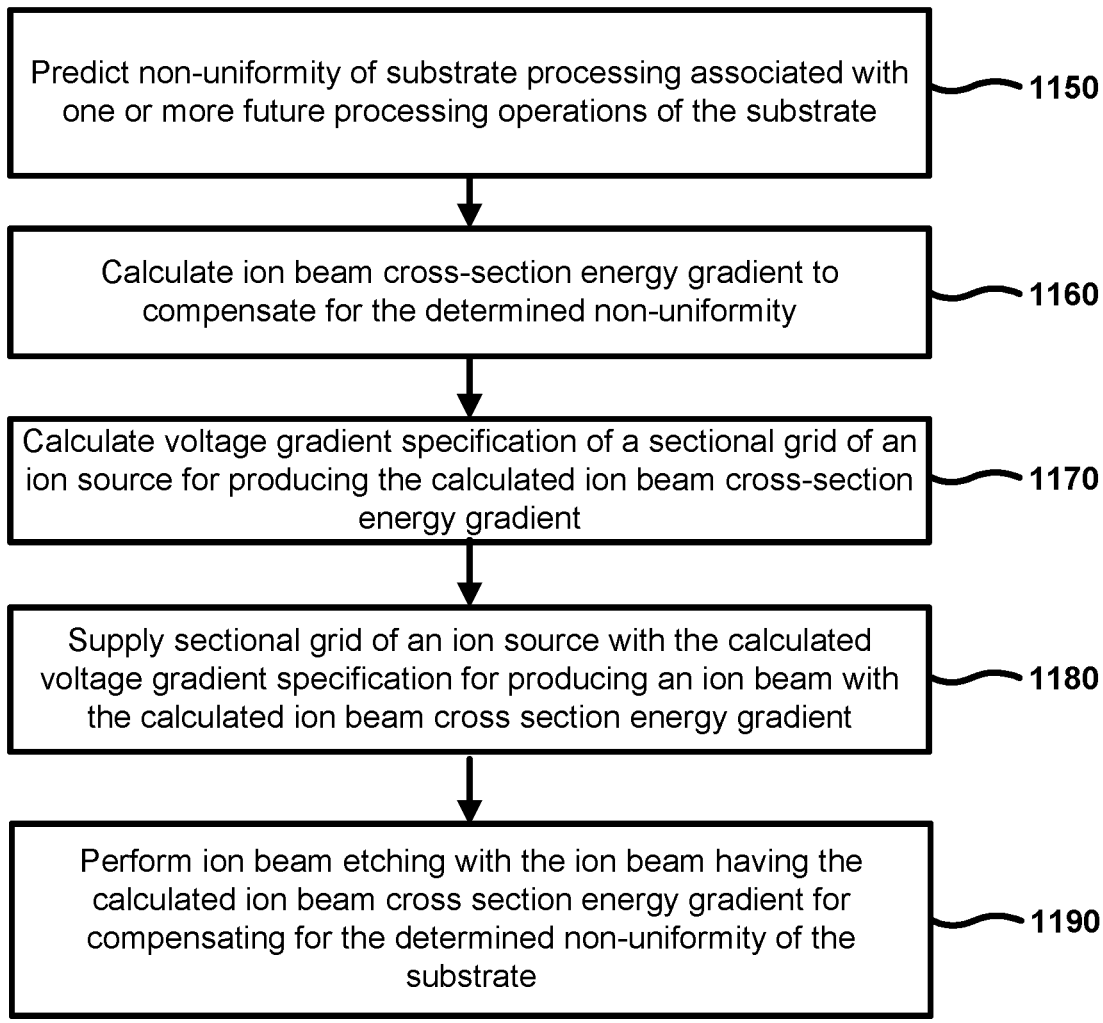

FIG. 11B is an overall flow of a method that is able to predict a future non-uniformity in substrate processing for a future processing step and pre-emptively adjust the ion density gradient for a present step to compensate or match the non-uniformity of the future processing step. The method includes an operation 1150 for predicting a non-uniformity of a substrate processing step associated with one or more future processing operations of the substrate. The substrate processing steps predicted to be non-uniform may be for deposition, dry or wet etching, milling, sputtering, patterning, lithography, implantation, and so on. It is contemplated that methods and system presented here are enabled to compensate, pre-empt, or match resulting non-uniformities from any of the abovementioned processes. The predicting may reference non-uniformity data from prior sequences, or it may predict in real-time the type and extent of the non-uniformity that is expected to occur based on the sequence of the processing steps. Again, the methods and systems contemplated here are envisioned to address non-uniformities resulting from positional bias and/or directional bias of features on the substrate.

In the next step, operation 1160 calculates an ion-beam cross-section energy gradient that is to compensate, match, counteract, or pre-empt the predicted non-uniformity, and operation 1170 calculates the voltage gradient specification that is to be used for each of voltage sections of the sectional grid. The subsequent operation, operation 1180, supplies each of voltage sections of the sectional grid based on the calculated voltage gradient from operation 1170 with the specified voltage to create the voltage gradient. The ion beam is to have an energy density gradient across its cross section that corresponds to the specification of operation 1160. Operation 1180 then subjects the substrate to the specified ion beam. In these embodiments, the substrate may undergo ion beam etching that is purposely made to be non-uniform in order to pre-empt future non-uniform processes. As a result, methods and system contemplated here are enabled to create finely tuned ion beams with varying energy density gradients that may be used for specific non-uniform etching to counteract past and/or future non-uniform processing steps in addition to providing uniform etching. As noted above, a single sectional grid such as those shown in FIGS. 9A-9D are able to achieve these various non-uniform and uniform etching steps because of the sectional grid's individually voltage controlled sections.

Computer programs for controlling delivery of reactant, plasma processing and other processes in a process sequence such as those shown in FIGS. 1a and 1B can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications may be practiced within the scope of the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A system for processing a substrate, comprising:
   a chamber;
   a chuck assembly disposed in the chamber including,
      a substrate support;
      a tilt actuator for tilting the substrate support to position the substrate at an angle; and
      a rotator for rotating the substrate support between 0 degrees and 180 degrees when positioned at said angle;
      an ion source coupled to the chamber and directionally oriented toward the substrate support of the chuck assembly, wherein the ion source is configured to generate ions when a plasma is struck, and wherein the angle of the substrate orients a first part of the substrate closer to the ion source than a second part of the substrate, and wherein said rotator rotates the substrate support to orient the first part of the substrate closer to the ion source when at 0 degrees and further from the ion source when rotated 180 degrees, wherein said ion source is only active when the substrate support is rotated and placed at either 0 degrees or 180 degrees; and a grid system that interfaces with the chamber and is directly facing the substrate support on one side and with the ion source on another side, wherein the grid system is circular and has a fixed orientation relative to the chamber and the ion source, and said grid system includes an array of holes for extracting ions from the ion source and for forming an ion beam, the grid system is oriented so the ion beam is directed into the chamber toward the substrate support, wherein the array of holes of the grid system is defined vertically by a y-axis and horizontally by an x-axis, wherein the array of holes is defined by hole densities that vary vertically in the y-axis by having a higher hole density in a bottom edge of the array of holes and extending to a lower hole density in a top edge of the array of holes, such that the ion beam is caused to have an energy density gradient that is defined vertically in the y-axis, and wherein the lower hole density is lower relative to the higher hole density; and wherein the array of holes in the x-axis includes a plurality of rows, wherein the plurality of rows extend between the bottom edge to the top edge of the array of holes and wherein, for each row of the plurality of rows, separations between adjacent holes within a same row do not vary horizontally;

wherein the angle of the substrate support and the rotator switching between 0 degrees and 180 degrees improves uniformity of ion exposure to sidewalls of features located on the substrate when said plasma is struck.

2. The system of claim 1, wherein the grid system includes a plurality of sections, and each section is horizontally disposed, such that an upper section along the y-axis has a lower hole density than a lower section along the y-axis.

3. The system of claim 1, wherein the grid system includes a plurality of sections, and each section has a different hole density, such that a lower section along the y-axis has a higher hole density than an upper section along the y-axis, wherein each of the plurality of sections is defined as a horizontal region along the x-axis.

4. The system of claim 1, wherein the grid system includes at least three sections, and each of said at least three sections has a different hole density defined by a lower most of said at least three sections having a higher hole density than an upper most of said at least three sections.

5. The system of claim 1, wherein the grid system includes two sections, and each section has a different hole density, wherein a lower of the two sections along the y-axis has a higher hole density than an upper of the two sections.

6. The system of claim 1, wherein the ion beam is characterized by an energy density that does not vary horizontally.

7. The system of claim 1, wherein the hole density of the array of holes is defined to decrease as a y-coordinate becomes more positive such that the ion beam is characterized by an energy density that decreases as the y-coordinate becomes more positive.

8. The system of claim 1, wherein the grid system is defined by a plurality of sections that extend horizontally across a width of the grid system, the plurality of sections dividing the grid system vertically, and wherein each section defines a hole density for a plurality of holes within each section.

9. The system of claim 8, wherein the grid system is defined by a first section and a second section, the first section is more positive in the y-axis than the second section, the first section defines a first plurality of holes and the second section defines a second plurality of holes, the second plurality of holes are defined to have a higher density in the grid system than the first plurality of holes.

10. The system of claim 8, wherein the plurality of sections defines respective hole densities that decrease as a y-coordinate associated with each of the plurality of sections become more positive.

11. The system of claim 1, wherein the substrate support is tilted such that a first region of the substrate support is closer to the grid system than a second region of the substrate support, wherein the first region and the second region of the substrate support experience a similar energy density of the ion beam caused at least in part by the array of holes defined by hole densities that vary vertically.

12. The system of claim 1, wherein the ion source further includes a sectional magnetic system that induces a magnetic field gradient such that the plasma is characterized by a higher electron density in a negative y direction, and a lower electron density in a positive y direction.

13. A system for processing a substrate, comprising:
a chamber;
a chuck assembly disposed in the chamber including,
a substrate support;
a tilt actuator for tilting the substrate support to position the substrate at an angle; and
a rotator for rotating the substrate support between 0 degrees and 180 degrees when positioned at said angle;
an ion source coupled to the chamber and directionally oriented toward the substrate support of the chuck assembly, wherein the ion source is configured to generate ions when a plasma is struck, and wherein the angle of the substrate orients a first part of the substrate closer to the ion source than a second part of the substrate, and wherein said rotator rotates the substrate support to orient the first part of the substrate closer to the ion source when at 0 degrees and further from the ion source when rotated 180 degrees, wherein said ion source is only active when the substrate support is rotated and placed at either 0 degrees or 180 degrees; and
a grid system that interfaces with the chamber and is directly facing the substrate support on one side and with the ion source on another side, wherein the grid system is circular and has a fixed orientation relative to the chamber and the ion source, wherein the grid system includes an array of holes defined vertically by a y-axis and horizontally by an x-axis for extracting ions from the ion source and for forming an ion beam, the grid system is oriented in said fixed orientation so that the ion beam is directed into the chamber toward the substrate support, the grid system is defined by a plurality of sections defined by one or more rows along the x-axis that are individually controlled for voltage, wherein an energy density of the ion beam is defined by respective voltages of the plurality of sections of the grid system;
wherein the plurality of sections extend between having a higher density in the ion beam in a bottom edge of the array of holes and a lower density in the ion beam in a top edge of the array of holes, wherein the higher density is higher relative to the lower density, and wherein the respective voltages of the plurality of sections are set to vary and establish decreased densities in the ion beam in the y-axis between the bottom edge and extending to the top edge;

wherein the angle of the substrate support and the rotator function to switch between 0 degrees and 180 degrees one or more times to improve uniform ion exposure to sidewalls of features located on the substrate when said plasma is struck.

14. The system of claim 13, wherein the respective voltages of the plurality of sections is caused to be less positive as a y-coordinate associated with each of the sections increases such that a voltage gradient is produced for the grid system, the voltage gradient of the grid system further causes the energy density of the ion beam to decrease as the y-coordinate increases.

15. The system of claim 14, wherein the substrate support is tilted such that a first region of the substrate support is closer to the grid system than a second region of the substrate support, wherein the first region and the second region of the substrate support experience a similar energy density of the ion beam caused at least in part by the voltage gradient of the grid system.

16. The system of claim 13, wherein the respective voltages for each of the plurality of sections is individually controlled in real time.

17. The system of claim 13, wherein the grid system is configured such that each hole of the array of holes is associated with an individual section of the plurality of sections such that each hole is individually definable for voltage.

18. The system of claim 17, wherein each hole is associated with a respective beamlet, wherein each respective beamlet is individually definable for beamlet energy.

19. The system of claim 13, wherein said respective voltages of the plurality of sections of the grid system are controlled to set less positive voltages in sections that are closer to an upper y-coordinate and more positive voltages in sections that are closer to a lower y-coordinate.

* * * * *